United States Patent
Birk et al.

(10) Patent No.: US 9,607,696 B2
(45) Date of Patent: Mar. 28, 2017

(54) MINIMAL MAXIMUM-LEVEL PROGRAMMING

(71) Applicant: Technion Research and Development Foundation LTD., Haifa (IL)

(72) Inventors: Yitzhak Birk, Hod Hasharon (IL); Amit Berman, Nesher (IL)

(73) Assignee: Technion research and development foundation Ltd., Haifa (IL)

( * ) Notice: Subject to any disclaimer, the term of this patent is extended or adjusted under 35 U.S.C. 154(b) by 228 days.

(21) Appl. No.: 14/260,292

(22) Filed: Apr. 24, 2014

(65) Prior Publication Data

US 2014/0328123 A1 Nov. 6, 2014

Related U.S. Application Data

(60) Provisional application No. 61/815,797, filed on Apr. 25, 2013.

(51) Int. Cl.
| | |
|---|---|
| *G11C 16/10* | (2006.01) |
| *G11C 16/04* | (2006.01) |
| *G11C 11/56* | (2006.01) |
| *G11C 16/34* | (2006.01) |
| *G11C 7/10* | (2006.01) |
| *G11C 13/00* | (2006.01) |

(52) U.S. Cl.
CPC ............ *G11C 16/10* (2013.01); *G11C 7/1006* (2013.01); *G11C 11/5628* (2013.01); *G11C 11/5678* (2013.01); *G11C 13/0004* (2013.01); *G11C 13/0064* (2013.01); *G11C 16/0483* (2013.01); *G11C 16/3468* (2013.01); *G11C 2013/0076* (2013.01); *G11C 2211/5621* (2013.01); *G11C 2211/5648* (2013.01)

(58) Field of Classification Search
CPC ... G11C 16/10; G11C 7/1006; G11C 11/5628; G11C 11/5678; G11C 13/0004; G11C 13/0064; G11C 16/0483; G11C 16/3468
USPC ...................... 711/103, 154, 156; 365/185.33
See application file for complete search history.

(56) References Cited

U.S. PATENT DOCUMENTS

| | | | |
|---|---|---|---|
| 7,724,564 B2 * | 5/2010 | Taylor ..................... | G11C 11/56 365/148 |
| 8,194,475 B2 * | 6/2012 | Taylor ..................... | G11C 11/56 365/148 |

(Continued)

OTHER PUBLICATIONS

J. Brewer, M. Gill, "Nonvolatile memory technologies with emphasis on flash", IEEE Press Series on Microelectronic Sys., 2008.

(Continued)

*Primary Examiner* — Stephen Elmore
(74) *Attorney, Agent, or Firm* — Reches Patents

(57) ABSTRACT

A method for writing data, the method may include evaluating current levels of multiple memory cells that belong to a certain set of memory cells or receiving an indication about the current levels of the multiple memory cells; encoding a new data unit to provide an encoded data unit to be written to the multiple memory cells while minimizing an amount of changes in levels of the maximum cell level among the multiple memory cells required for storing the encoded data unit; and writing the encoded data unit to the multiple memory cells.

15 Claims, 20 Drawing Sheets

(56) References Cited

U.S. PATENT DOCUMENTS

| | | | | |
|---|---|---|---|---|
| 8,879,319 B1* | 11/2014 | Cassuto | ................ | G11C 16/10 365/185.03 |
| 2010/0027336 A1* | 2/2010 | Park | ................ | G11C 11/5628 365/185.09 |
| 2012/0210082 A1* | 8/2012 | Sharon | ................ | G11C 7/1006 711/154 |

OTHER PUBLICATIONS

B. Lee, E. Ipek, O.Mutlu, and D. Burger. "Architecting phase change memory as a scalable DRAM alternative". In ISCA-36, 2009.

Laura M. Grupp et-al., "The Bleak Future of NAND Flash Memory", 10th USENIX conf. on file and storage technologies (FAST), 2012.

S. Lee, K. Ha, K. Zhang, J. Kim, and J. Kim, "FlexFS: A Flexible Flash File System for MLC NAND Flash Memory", USENIX Annual Technical Conference, 2009.

K. Takeuchi, et-al. "A multipage cell architecture for high-speed programming multilevel NAND flash memories", Journal of Solid-State Circuits (JSSC), 1998.

R.L. Rivest and A. Shamir, "How to reuse a write-once memory," Infor-mation and Control, vol. 55, Nos. 1-3, pp. 1-19, 1982.

A. Jiang, R. Mateescu, M. Schwartz and J. Bruck, "Rank Modulation for Flash Memories", IEEE Transactions on Information Theory, vol. 55, No. 6, pp. 2659-2673, Jun. 2009.

K. D. Suh et al., "A 3.3V 32Mb NAND flash memory with incremental step pulse programming scheme," ISSCC, pp. 128-129, 1995.

F. Bedeschi, R. Fackenthal, C. Resta, E. Donze et al., "A bipolar-selected phase change memory featuring multi-level cell storage," IEEE Journal of Solid-State Circuits, vol. 44, No. 1, pp. 217-227, 2009.

M. Joshi, Wangyuan Zhang, Tao Li, "Mercury: A fast and energy-efficient multi-level cell based Phase Change Memory system", IEEE High Performance Computer Architecture (HPCA'11), 2011.

J. Hu et-al., "Write Activity Minimization for Nonvolatile Main Memory Via Scheduling and Recomputation", IEEE Trans. on Computer-Aided Design of Integrated Circuits and Systems. vol. 30, 2011.

T. Nirschl et al., Write strategies for 2 and 4-bit multi-level phase-change memory. In IEDM '07: Proceedings of the 2007 IEEE International Electron Devices Meeting, 2007.

J.-T. Lin, Y.-B. Liao, M.-H. Chiang, and W.-C. Hsu, "Operation of multi-level phase change memory using various programming techniques," in Proc. IEEE Int. Conf. on IC Design and Technology, May 2009, pp. 199-202.

Moinuddin K. et-al. "Improving Read Performance of Phase Change Memories via Write Cancellation and Write Pausing", IEEE High Performance Computer Architecture (HPCA'10), 2010.

G. Hemink et-al. "Fast and accurate programming meothd for multi-level NAND EEPROMs", Symp. on VLSI Tech., pp. 129-130, 1995.

M. Grossi et-al., "Program Schemes for Multilevel Flash Memories", Proceedings of the IEEE, vol. 91, No. 4, 2003.

H. Kim,. et-al., "A 159mm2 32nm 32Gb MLC NAND-Flash Memory with 200MB/s Asynchronous DDR Interface", in IEEE International Solid-State Circuits Conference (ISSCC), 2010.

T. Tanaka et-al. "A quick interllgent page-programming architecture and a Shielded bitline sensing method for 3V-only NAND flash memory". IEEE J. solid-state circuits, vol. 29, No. 11, Nov. 1994.

T. Hara et-al. "A 146mm2 8Gb NAND flash memory with 70nm CMOS technolgy", Intl. Solid-State Circuits Conf. (ISSCC), pp. 44-45, 2006.

S. Chang et-al., "A 48nm 32gb 8-level NAND flash memory with 5.5mb/s program throughput",, in IEEE International Solid-State Circuits Conference (ISSCC), 2009.

A. Berman, Y. Birk, "Constrained Flash Memory Programming", Intl. Sym. Information Theory (ISIT), 2011.

K. Takeuchi et-al., "A 56nm CMOS 99mm2 8Gb multi-level NAND flash memory with 10Mbyte/sec program throughput". ISSCC, 2006.

C. Trinh1et-al, "13.6 A 5.6MB/s 64Gb 4b/Cell NAND Flash Memory in 43nm CMOS", in IEEE International Solid-State Circuits Conference (ISSCC) 2009.

Joowon Hwang et-al., "A middle-1X nm NAND flash memory cell (M1X-NAND) with highly manufacturable integration technologies", IEEE International Electron Device Meeting (IEDM), 2011.

K. Imamiya et-al., "A 130mm 256Mb NAND flash with shallow trench isolation technology", ISSCC, pp. 112-113, 1999.

T. Futatsuyama et-al., "A 113mm2 32Gb 3b/cell NAND Flash memory", in IEEE International Solid-State Circuits Conference (ISSCC), 2009.

Yan Li1 et-al. "128Gb 3b/Cell NAND Flash Memory in 19nm Technology with 18MB/s Write Rate and 400Mb/s Toggle Mode", in IEEE International Solid-State Circuits Conference (ISSCC'12) 2012.

* cited by examiner

| Cell-1/Cell-2 | Page 3 data ||
|---|---|---|
| | 0 | 1 |
| 0-0 | 0-0 | 1-2 |
| 0-1 | 0-1 | 0-2 |
| 1-0 | 1-0 | 2-0 |
| 1-1 | 1-1 | 2-1 |

310

| Cell-1/Cell-2 | Page 4 data ||
|---|---|---|
| | 0 | 1 |
| 0-0 | 0-0 | 2-2 |
| 0-1 | 0-1 | 2-3 |
| 1-0 | 1-0 | 3-2 |
| 1-1 | 1-1 | 3-3 |
| 1-2 | 1-2 | 1-3 |
| 0-2 | 0-2 | 0-3 |
| 2-0 | 2-0 | 3-0 |
| 2-1 | 2-1 | 3-1 |

ATC(1)  ATC(2)  ATC(3)  ATC(4)  Levels
                                0,1

ATC(5)           ATC(6)      Levels
                                0,1,2

ATC(7)           ATC(8)      Levels
                                0,1,2,3

ATC(9)                  Levels
                                0,1,2,3,4

ATC(10)                 Levels
                                0,1,2,3,4,5

ATC(11)                 Levels
                                0,1,2,3,4,5,6

ATC(12)                 Levels
                                0,1,2,3,4,5,6,7

400

ATC(1)  ATC(2)   Levels
                    0,1

ATC(3)        Levels
                    0,1,2

ATC(4)        Levels
                    0,1,2,3

MINIMAL MAXIMUM-LEVEL PROGRAMMING

RELATED APPLICATIONS

This application claims priority from U.S. provisional patent Ser. No. 61/815,797 filing date Apr. 25, 2013 which is incorporated herein by reference.

BACKGROUND

The following references illustrate the state of the art:
[1] J. Brewer, M. Gill, "Nonvolatile memory technologies with emphasis on flash", IEEE Press Series on Microelectronic Sys., 2008.
[2] B. Lee, E. Ipek, O. Mutlu, and D. Burger. "Architecting phase change memory as a scalable DRAM alternative". In ISCA-36, 2009.
[3] Laura M. Grupp et-al., "The Bleak Future of NAND Flash Memory", 10th USENIX conf. on file and storage technologies (FAST), 2012.
[4] Laura M. Grupp, Adrian M. Caulfield, Joel Coburn, Steven Swanson, "Characterizing Flash Memory: Anomalies, Observations, and Applications", MICRO'09.
[5] Samsung Electronics, "K9NBG08U5M 4 Gb*8 Bit NAND Flash Memory Data Sheet".
[6] Samsung Electronics, "K9GAG08U0M 2 Gb*8 Bit NAND Flash Memory Data Sheet".
[7] S. Lee, K. Ha, K. Zhang, J. Kim, and J. Kim, "FlexFS: A Flexible Flash File System for MLC NAND Flash Memory", USENIX Annual Technical Conference, 2009.
[8] K. Takeuchi, et-al. "A multipage cell architecture for high-speed programming multilevel NAND flash memories", Journal of Solid-State Circuits (JSSC), 1998.
[9] R. L. Rivest and A. Shamir, "How to reuse a write-once memory," Infor- mation and Control, vol. 55, nos. 1-3, pp. 1-19, 1982.
[10] A. Jiang, R. Mateescu, M. Schwartz and J. Bruck, "Rank Modulation for Flash Memories", IEEE Transactions on Information Theory, vol. 55, no. 6, pp. 2659-2673, June 2009.
[11] K. D. Suh et al., "A 3.3V 32 Mb NAND flash memory with incremental step pulse programming scheme," ISSCC, pp. 128-129, 1995.
[12] PCMARK-VANTAGE, "White paper v1.0", http://www.futuremark.com/benchmarks/pcmarkvantage/support/
[13] F. Bedeschi, R. Fackenthal, C. Resta, E. Donze et al., "A bipolar-selected phase change memory featuring multi-level cell storage," IEEE Journal of Solid-State Circuits, vol. 44, no. 1, pp. 217-227, 2009.
[14] M. Joshi, Wangyuan Zhang, Tao Li, "Mercury: A fast and energy-efficient multi-level cell based Phase Change Memory system", IEEE High Performance Computer Architecture (HPOA' 11), 2011.
[15] J. Hu et-al., "Write Activity Minimization for Nonvolatile Main Memory Via Scheduling and Recomputation", IEEE Trans. on Computer-Aided Design of Integrated Circuits and Systems. Vol. 30, 2011.
[16] T. Nirschl et al., "Write strategies for 2 and 4-bit multi-level phase-change memory. In IEDM '07: Proceedings of the 2007 IEEE International Electron Devices Meeting, 2007.
[17] J.-T. Lin, Y.-B. Liao, M.-H. Chiang, and W.-C. Hsu, "Operation of multi-level phase change memory using various programming techniques," in Proc. IEEE Int. Conf. on IC Design and Technology, May 2009, pp. 199-202.
[18] HanBin Yoon, Naveen Muralimanohar, Justin Meza, Onur Mutlu, Norman P. Jouppi, "Data Mapping for Higher Performance and Energy Efficiency in Multi-Level Phase Change Memory", NVMW'12
[19] Moinuddin K. et-al. "Improving Read Performance of Phase Change Memories via Write Cancellation and Write Pausing", IEEE High Performance Computer Architecture (HPOA'10), 2010.
[20] G. Hemink et-al. "Fast and accurate programming meothd for multi-level NAND EEPROMs", Symp. on VLSI Tech., pp. 129-130, 1995.
[21] K. D. Suh et al., "A 3.3V 32 Mb NAND flash memory with incremental step pulse programming scheme," ISSCC, pp. 128-129, 1995.
[22] M. Grossi et-al., "Program Schemes for Multilevel Flash Memories", Proceedings of the IEEE, Vol. 91, No. 4, 2003.
[23] H. Kim,. et-al., "A 159 mm$^2$ 32 nm 32 Gb MLC NAND-Flash Memory with 200 MB/s Asynchronous DDR Interface", in IEEE International Solid-State Circuits Conference (ISSCC), 2010.
[24] T. Tanaka et-al. "A quick interlligent page-programming architecture and a Shielded bitline sensing method for 3V-only NAND flash memory". IEEE J. solid-state circuits, Vol. 29, No. 11, Nov. 1994.
[25] T. Hara et-al. "A 146 mm$^2$ 8 Gb NAND flash memory with 70 nm CMOS technolgy", Intl. Solid-State Circuits Conf. (ISSCC), pp. 44-45, 2006.
[26] S. Chang et-al., "A 48 nm 32 gb 8-level NAND flash memory with 5.5 mb/s program throughput", ", in IEEE International Solid-State Circuits Conference (ISSCC), 2009.
[27] A. Berman, Y. Birk, "Constrained Flash Memory Programming", Intl. Sym. Information Theory (ISIT), 2011.
[28] K. Takeuchi et-al., "A 56 nm CMOS 99 mm$^2$ 8 Gb multi-level NAND flash memory with 10 Mbyte/sec program throughput". ISSCC, 2006.
[29] C. Trinhlet-al, "13.6 A 5.6 MB/s 64 Gb 4 b/Cell NAND Flash Memory in 43 nm CMOS", in IEEE International Solid-State Circuits Conference (ISSCC) 2009.
[30] Joowon Hwang et-al., "A middle-1x nm NAND flash memory cell (M1x-NAND) with highly manufacturable integration technologies", IEEE International Electron Device Meeting (IEDM), 2011.
[31] K. Imamiya et-al., "A 130 mm 256 Mb NAND flash with shallow trench isolation technology", ISSCC, pp. 112-113, 1999.
[32] T. Futatsuyama et-al., "A 113 mm2 32 Gb 3 b/cell NAND Flash memory", in IEEE International Solid-State Circuits Conference (ISSCC), 2009.
[33] Yan Lil et-al. "128 Gb 3 b/Cell NAND Flash Memory in 19 nm Technology with 18 MB/s Write Rate and 400 Mb/s Toggle Mode", in IEEE International Solid-State Circuits Conference (ISSCC'12) 2012.

NAND Flash is currently the most prominent non-volatile semiconductor memory technology, used mostly for storage [1]. Phase-Change Memory (PCM) is viewed by some as a possible replacement for DRAM [2]. Both Flash and PCM employ multi-level cells (MLC) [1,2], and designers strive to increase density by reducing cell size and increasing the number of levels. (Single-level cells (SLC), namely cells with an "erased" level and a single non-erased level, capable of holding a single bit of information, are also used.)

Performance implications of MLC

Flash MLC programming (writing) entails several steps: first, a data page is transferred from the host to an on-chip memory buffer; next, a high voltage pulse (program pulse) is applied to the cells being programmed. A program pulse's impact on different cells may vary due to manufacturing variations. Also, decreasing a cell's level entails applying voltage to the bulk, so it cannot be performed to individual cells. Consequently, over-programming of a cell must be avoided, or held down to a minimum so that error correction codes can be employed at reasonable cost and used to correct resulting errors. Programming is therefore carried out via a sequence of small pulses, each followed by read in order to verify the cell's level. The program-verify cycle is repeated until the desired levels are achieved [1].

TABLE 1

| | | PCM | NAND Flash |
|---|---|---|---|
| Read Latency | SLC | 10 ns | 25 μs |
| | MLC | 44 ns | 50 μs |
| Write Latency | SLC | 100 ns | 200 μs |
| | MLC | 395 ns | 900 μs |

Table 1 illustrates a latency of SLC and 4-level MLC in PCM and Flash memories [3,4,5,6].

Write latency increases with an increase in the number of levels. As seen in Table 1, it increases faster than the increase in the number of levels, e.g., from 200 μs for 2-level cells to 900 μs for 4-level cells.

A cell's level is determined by applying a reference voltage to it and comparing the cell's threshold voltage to it. While each read-verify (during Write) entails a single reference comparison, the determination of a cell's level during read requires multiple reference comparisons, each with a different reference voltage. Therefore, read latency also increases with an increase in the number of levels [3] (Table 1).

The move to MLC, while beneficial in terms of storage capacity and cost per bit, comes at a performance penalty. Moreover, with an increase in capacity and a reduction in performance, the "normalized" performance drop is dramatic. There is therefore a true need for schemes that can somehow mitigate the performance drop.

Another problem with MLC is endurance, namely the permissible number of erasure cycles that a cell may undergo before it degrades. Endurance can be 10× lower for 4-level cells than for 2-level cells. This invention does not directly address endurance.

The key to all schemes for mitigating the performance drop, specifically the increase in read and/or write latency, is a critical observation whereby if the maximum (over cells being accessed) current cell level (for read) and cell target level (for write) is known, then one can save time. For example, if the maximum target level is 2 then one need not spend the time for reaching level 3 or above. Similarly, if (when reading), it is known that all cells are at one of the first two levels, the number of reference comparisons can be reduced accordingly.

In FlexFS [7], the file system dynamically decides whether to use any given physical page as SLC or MLC. Use in SLC mode increases endurance and accelerates access. In all modes, any given cell contains data belonging to a single data page. The number of cells per data page varies with the number of levels being used, reflecting the change in cell capacity and keeping a fixed logical (data) page size. In any case, a page (and, in fact, the entire physical block of cells containing it) must be erased when switching its mode.

In Multipage Programming (MP) [8], each 4-level cell is shared among two pages. A physical page's capacity equals twice that of a logical page. The two logical pages sharing a physical page are typically written one at a time. The content of the first page being written determines one bit in the level number of a cell, and the second page determines the value of the other bit. When writing the second page, one must first read the cell to determine its current level, as the cell's final level is determined by the values of the both pages' bits. MP has several salient features: 1) when writing the first of the two "partner" pages, only the two lower levels are used, so writing is as fast as for SLC; 2) as long as the second page has not been written, reading of the first one is also fast; 3) no erasure is required when switching from SLC to MLC; and 4) Once the second page has been written, this slows down the reading of both pages, as one must determine the exact level of the cell, which may be any of the four levels.

It is important to note that both MP and our new scheme, MMLP, are fundamentally different from various coding schemes that are used to permit multiple writes to MLC pages between erasures. (Examples of the latter include WOM codes [9] and Rank Modulation [10].) In the other schemes, the old content is lost, whereas both MP and MMLP add information without harming the old one.

SUMMARY OF THE INVENTION

Various methods may be provided and are described in the specification. Various embodiments of the invention there may be provided a non-transitory computer readable medium that may store instructions for performing any of the methods described in the specification and any steps thereof, including any combinations of same. Additional embodiments of the invention include a storage system arranged to execute any or all of the methods described in the specification above, including any stages-and any combinations of same.

There may be provided a method for writing data that may include evaluating current levels of multiple memory cells that belong to a certain set of memory cells or receiving an indication about the current levels of the multiple memory cells; encoding a new data unit to provide an encoded data unit to be written to the multiple memory cells while minimizing an amount of changes in levels of the multiple memory cells required for storing the encoded data unit; and writing the encoded data unit to the multiple memory cells.

The method may include defining the encoding so that a $k^{th}$ writing of a data bit to a memory cell comprises utilizing only a lowest (k+1)'th levels of the memory cell.

The multiple memory cells may be flash memory cells.

The method may include writing to the multiple memory cells multiple encoded data units that belong to multiple logical pages whereby a plurality of memory cells of the multiple memory cells store information relating to more than a single logical page; and generating error correction information that reflects a state of the multiple memory cells.

The method may include generating the error correction information only after reaching a maximal capacity of the multiple memory cells.

There may be provided a method for writing data, may include: evaluating current levels of multiple memory cells that belong to a certain set of memory cells or receiving an indication about the current levels of the multiple memory cells; selecting a selected encoding scheme out of multiple encoding schemes for encoding a new data unit to provide an encoded data unit to be written to the multiple memory cells; wherein the selection is responsive to an amount of changes in levels of the multiple memory cells required for storing the encoded data unit for each encoding scheme; encoding the data unit using the selected encoding scheme; and writing the encoded data unit to the certain set of memory cells.

The method may include selecting the encoding scheme that is expected to cause a lowest amount of changes in the levels of the multiple memory cells.

The method may include applying the selected encoding scheme so that a $k^{th}$ writing of a data bit to a memory cell comprises utilizing only a lowest $(k+1)$'th levels of the memory cell.

The memory cells may be flash memory cells.

There may be provided a system include a memory controller that comprises a read circuit, a write circuit and an encoder; wherein the read circuit is arranged to evaluate current levels of multiple memory cells that belong to a certain set of memory cells or receiving an indication about the current levels of the multiple memory cells; wherein the encoder is arranged to encode a new data unit to be written to the certain set of memory cells to provide an encoded data unit to be written to the certain set of memory cells while minimizing an amount of changes in levels of the multiple memory cells required for storing the encoded data unit; and wherein the write circuit is arranged to write the encoded data unit to the certain set of memory cells.

The encoder is arranged to perform the encoding so that a $k^{th}$ writing of a data bit to a memory cell comprises utilizing only a lowest $(k+1)$'th levels of the memory cell.

The memory cells may be flash memory cells.

The write circuit may be arranged to write to the multiple memory cells multiple encoded data units that belong to multiple logical pages wherein a plurality of memory cells of the multiple memory cells store information relating to more than a single logical page; and wherein the encoder is further adapted to generate error correction information that reflects a state of the multiple memory cells.

The encoder may be arranged to generate the error correction information only after reaching a maximal capacity of the multiple memory cells.

There may be provided a system that may include a memory controller that comprises a read circuit, a write circuit and an encoder; wherein the read circuit is arranged to evaluate current levels of multiple memory cells that belong to a certain set of memory cells or receiving an indication about the current levels of the multiple memory cells; wherein the encoder is arranged to select a selected encoding scheme out of multiple encoding schemes for encoding a new data unit to be written to the certain set of memory cells to provide an encoded data unit to be written to the certain set of memory cells; wherein the selection is responsive to an amount of changes in levels of the multiple memory cells required for storing the encoded data unit for each encoding scheme; and to encode the data unit using the selected encoding scheme; and wherein the write circuit is arranged to write the encoded data unit to the certain set of memory cells.

The encoder is arranged to select the encoding scheme that is expected to cause a lowest amount of changes in the levels of the multiple memory cells.

The encoder is arranged to apply the selected encoding scheme so that a $k^{th}$ writing of a data bit to a memory cell comprises utilizing only a lowest $(k+1)$'th levels of the memory cell.

The memory cells may be flash memory cells.

There may be provided a non-transitory computer readable medium that stores instructions for: evaluating current levels of multiple memory cells that belong to a certain set of memory cells or receiving an indication about the current levels of the multiple memory cells; encoding a new data unit to provide an encoded data unit to be written to the multiple memory cells while minimizing an amount of changes in levels of the multiple memory cells required for storing the encoded data unit; and writing the encoded data unit to the multiple memory cells.

There may be provided a method for reading data that may include: performing a plurality of read iterations to provide a plurality of read results; reconstructing an encoded data unit based upon a comparison between at least two read results; decoding the encoded data unit to provide a data unit; wherein the decoding ideally reverses an encoding scheme used to generate the encoded data unit; wherein the encoding scheme minimized an amount of changes in levels of the multiple memory cells required for storing the encoded data unit.

There may be provided a method that may include receiving an indication about a maximal utilized level of multiple memory cells that belong to a certain set of memory cells or evaluating the maximal utilized level; and determining a required amount of the plurality of read iterations based upon the maximal utilized level.

There may be provided a method for writing data that may include encoding multiple data units to provide multiple encoded data units; and performing multiple write operations of the multiple encoded data units to multiple level memory cells while limiting a utilization of levels of the multiple level memory cells so that a $k^{th}$ write operation of a data bit to a multiple level memory cell comprises utilizing only a lowest $(k+1)$'th levels of the multiple level memory cell.

There may be provided a non-transitory computer readable medium that stores instructions for: encoding multiple data units to provide multiple encoded data units; performing multiple write operation of the multiple encoded data units to multiple level memory cells while limiting a utilization of levels of the multiple level memory cells so that a $k^{th}$ write operation of a data bit to a multiple level memory cell comprises utilizing only a lowest $(k+1)$'th levels of the multiple level memory cell.

There may be provided a system that may include a memory controller that may include a write circuit and an encoder; wherein the encoder is arranged to encode multiple data units to provide multiple encoded data units; and wherein the write circuit is arranged to perform multiple write operation of the multiple encoded data units to multiple level memory cells while limiting a utilization of levels of the multiple level memory cells so that a $k^{th}$ write operation of a data bit to a multiple level memory cell may include utilizing only a lowest $(k+1)$'th levels of the multiple level memory cell.

There may be provided a method for writing up to $(K \cdot \log_2 K)/2$ data pages to $K/2$ pagelets that may include memory cells capable of storing K distinguishable charge levels, K being equal to an integer power of 2, may include: allocating the cells of one pagelet for an first data page; for an integer j, initially equal 1 and not greater than K, performing an iteration of a process that may include: doubling a number of pagelets in comparison to a number of current pagelets allocated during a previous iteration of the process by adding new pagelets; doubling the value of j; virtually copying to the new pagelets a cell allocation that was implemented during the previous iteration of the process, said allocation of cells made to an additional number of data pages equal to the number of data pages that received cell allocations so far; for each of j/2 additional data pages, allocate all the cells of the pagelets of the current iteration, both new and old; where said allocations of pagelets to data pages are not exclusive.

If K differs from an integer power of 2, applying the process for a smallest power of 2 that is greater than K, and mapping only a number of data pages that utilize physically existing levels.

The method may include for each successive data page allocated all the cells of the current pagelets of its iteration, assigning to each page one additional charge level for use in writing its data; wherein said level allocations are non-exclusive.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 3 shows encoding tables and addresses according to an embodiment of the invention;

FIG. 4 depicts an ATC mapping of twelve data pages into a single physical page, as well as the utilized levels after programming each page according to an embodiment of the invention;

Figure 1:
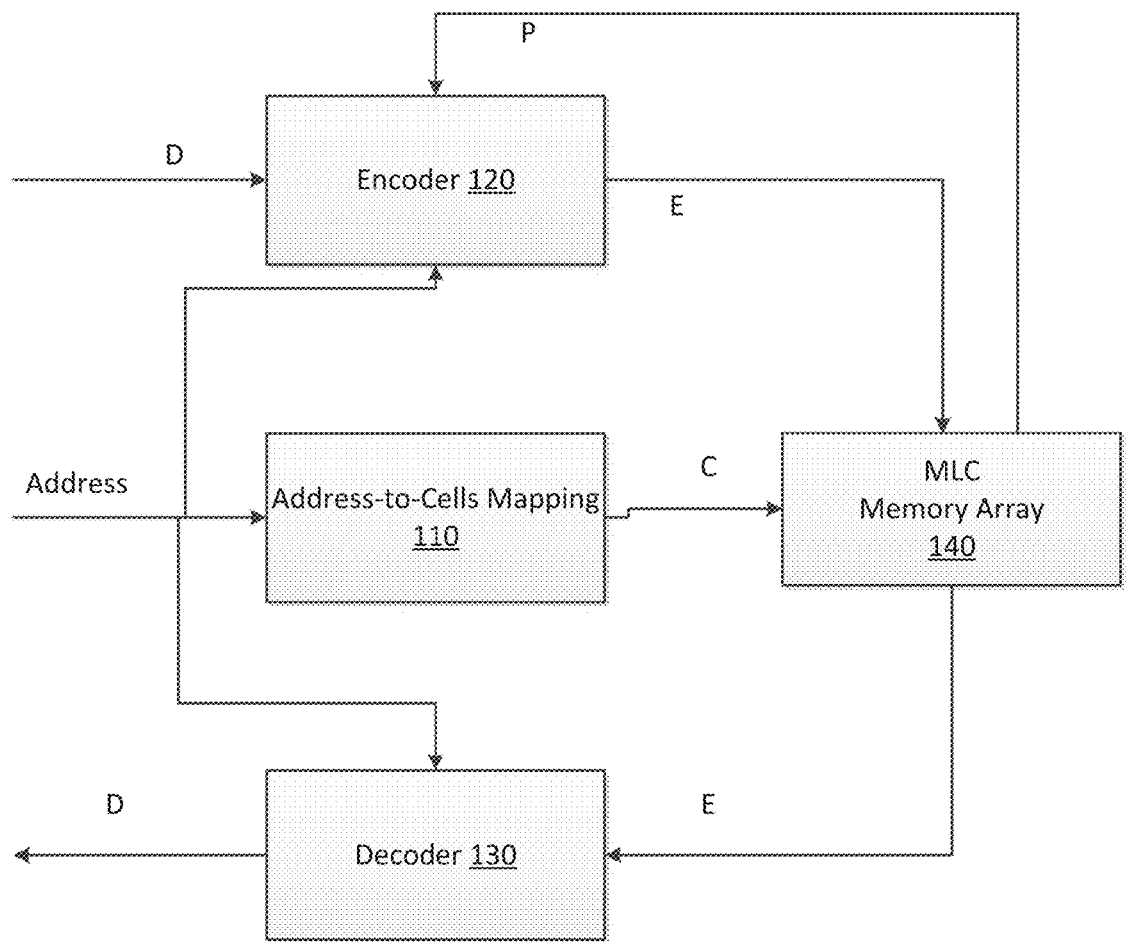
FIG. 1 illustrates a memory controller and a multi-level-cell (MLC) memory array according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

There is provided a Minimal Maximum-Level Programming (MMLP), a scheme for expediting cell writing by sharing physical cells among multiple data pages, letting each information bit affect the level of at least one memory cell, and exploiting the fact that making moderate changes to a cell's level is faster than making large ones. Reading is also expedited by reduction in reference comparisons. In a four-level cell example, we achieve 32% reduction in write/read latency relative to prior art with negligible area overhead.

We propose and evaluate minimal maximum-level programming (MMLP), a scheme to accelerate MLC memory access. MMLP encodes the data such that in the $k^{th}$ writing of data to a cell, only the lowest k+1 levels are utilized (including the erase level). Therefore, cell levels are used gradually, which leads to fewer programming pulses and read reference comparisons. Unlike in previously proposed cell-sharing schemes, different same-size data pages may use different numbers of physical cells, and a cell may hold a fraction of a bit of a given data page. Nevertheless, the exposed page size remains unchanged and data may be encoded without redundancy, so no capacity is lost. For facility of exposition, the discussion will focus on Flash. MMLP may also be adaptable to other MLC memory technologies.

There is provided a method, system and computer readable medium that may spread information of different data pages across different numbers of physical cells and, additionally or alternatively may have at least one information bit of at least one data page affect the levels of at least two cells—even in the absence of error correction coding. When implementing MMLP with no error correction coding (ECC), each information bit of any given data page affects a set of cells that is disjoint of those affected by that page's other information bits. It is noted that MMLP can be implemented with ECC.

Taxonomy

D—logical or data page (or simply page)—a page of data as viewed by the host. Its size is typically fixed, typically 2-4 kB.

Physical page—a set of cells jointly storing one or more entire data pages and only those. Data of any given logical page may be scattered across a subset of cells whose joint capacity exceeds the logical page size.

Pagelet—a set of cells within a single physical page, the number of cells equaling the number of bits in a data page. A physical page comprises several non-overlapping pagelets. A data page is stored across one more pagelets in the same physical page.

C—a set of cells jointly storing a given data page (and possibly additional pages or parts thereof).

P—the set of levels of the cells in C.

E—the data as encoded by MMLP.

MaxLevel(C)—the current highest level of any cell in C.

Address—this merely refers to the location of a logical page in its physical page, as if there is only one physical page. With MMLP, the (already existing) mapping tables would map a logical page number to physical_page.address.

Normally (most but not all prior art), a single physical page is capable of storing a single data (="logical") page. In this situation, a mapping of logical to physical page number suffices. In the current application, a physical page is larger than a data page and is capable of storing several data pages. The mapping therefore specifies for each data page the physical page in which it resides and its location within that physical page. This latter information is referred to as address.

Since the organization of data pages within a physical page is normally fixed, there is no need to specify its details for each data page. This side information, namely the cells of a physical page that are being used by any given Address, exists once, similarly to information pertaining to the encoding used to represent the data.

Address (as used in this specification) usually corresponds to the order in which data pages are written into a given physical page: the first one uses the first Address, the second one uses the second, etc. In some cases we must write in that order, because otherwise this won't be MMLP—we would use more levels than the minimum and it may even be that it would be impossible to properly encode the later-written page, because the encoding assumes that, when writing a later page (one that also uses higher charge levels), the levels to which cells are set are also based on the content of the earlier-written at least one page in the same cells.

MMLP Overview

MMLP comprises address-to-cells mapping, encoder and decoder components—as illustrated in FIG. 1. The memory controller 100 includes a mapper (address-to-cell mapping) 110, encoder 120 and decoder 130.

Address-to-Cells (ATC) Mapping 110.

The mapping may depend on the number of levels per cell. The construction is recursive.

2-Level Cells.

A physical page includes a single pagelet, and its storage capacity is a single (data) page. Each page is thus stored in its own pagelet and physical page.

Doubling the Number of Levels per Cell (from L/2 to L)

1) Double the number of pagelets per physical page.

2) Duplicate the ATC with the pre-doubling number of levels, with each "copy" of the ATC using a distinct half of the pagelets.

3) map L/2 additional pages to the physical page such that each of those is stored across all the pagelets constituting this physical page.

4) number the addresses (from scratch) in non-descending order of the number of pagelets across which a page is spread.

FIG. 4 depicts the resulting mapping for 4- and for 8-level cells. Referring to the address enumeration in that figure, a physical page comprising 2-level cells would only have a single pagelet and only ATC(1). With 4-level cells, a physical cell would comprise two pagelets (step 1), and would be able to store four pages because each cell can now store two bits. The first two pages, each residing in a different pagelet, are mapped to the locations marked ATC(1), ATC(2) (step 2). Finally, the two remaining pages are mapped to ATC(3) and ATC(4) in the figure, with each of them stored across the entire physical page (step 3). Had the figure not been drawn for 8-level cells, the mappings would have been marked ATC(1)-ATC(4).

Observing FIG. 4, one can readily see that the construction for 8-level cells was obtained by placing two copies of the 4-level cell mapping side by side, then adding 8/2=4 pages, each stored across the entire physical page (4 pagelets at this point), and renumbering the page locations.

If the number of levels is not an integer power of 2, the mapping is constructed for the next integer power of two but the number of pages mapped in step 3 is such that the number of "layers" equals the number of levels minus one. With 6-level cells, for example, ATC(11) and ATC(12) would be dropped.

Writing and Reading

Figure 5:
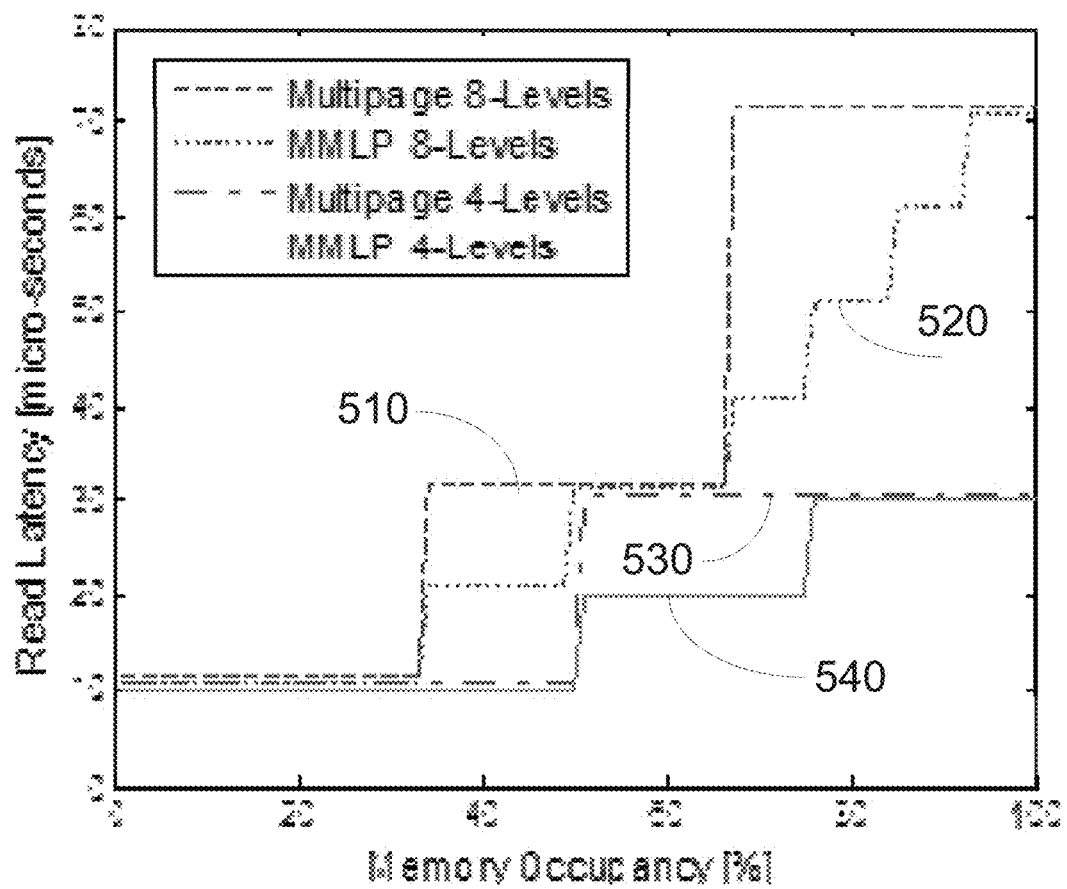
FIG. 5 depicts read latency vs. memory occupancy for 4- and 8-level MMLP and Multipage techniques according to an embodiment of the invention.

Writing to any cell that is shared by multiple pages must take place in ascending address order. (For simplicity, one can think of this as always writing in ascending address order.) Also, as indicated in FIG. 5, the kth writing of data to a cell may only raise it to levels up to k. Of course, the level cannot be reduced. Consequently, writing to low addresses is much faster than to high ones, and mean writing time is reduced relative to that with conventional mapping. Finally, note that pages in all but the base level (low addresses) are stored across multiple pagelets, implying that each cell stores a fraction of a bit of such a page.

Reading. Decoding a data page requires the determination of the levels of all the cells across which it is stored, as well as the prior decoding of all pages that share those cells and were written after the writing of the page of interest. The maximum possible cell level, MaxLevel(C), is optionally known for each pagelet (optionally stored metadata). Whenever a pagelet is not fully utilized, this can reduce the required number of reference comparisons. For example, if only pages 1 and 2 were stored, a single reference comparison suffices. With 8-level cells, reading addresses 8 and 10 requires at least two and four reference comparisons, respectively. Decoding employs combinational logic, so its latency is negligible (nano-seconds) relative to that of reference comparisons (tens of micro-seconds).

8-Level (3-bit) Cell MMLP

FIG. 4 also depicts the ATC for such cells, aka TLC, mapping 12 data pages into a single physical page, as well as the utilized levels after programming each page. An address in the range 9-12 has 0.25 bit stored in each cell.

Accordingly—given an address (as defined), ATC determines the set of memory cells C to which that address is mapped, as well as MaxLevel(C).

According to an embodiment of the invention there is provided a recursive algorithm of Address-to-cells mapping.

The recursive algorithm provides an example of address-to-cells (ATC) mapping; i.e., given a physical page whose storage capacity exceeds the size of a data page, and with at least three charge levels (including the erased level) per cell, determining the subsets of that physical page's cells into which each of at least two data pages can be written. These subsets of cells are referred to as Addresses, and different Addresses may share some or all of their cells. Together with the identity of the chosen physical page, the Address forms the full physical address of a given data page. The terms "wordline" and "physical page" are used synonymously.

The description is provided for fixed size data pages, with the size of a physical page changing according to the number of levels in a cell. As any person skilled in the field would appreciate, one can instead use fixed size physical pages and vary the data page size, or use several physical pages instead of a single one.

Baseline Step (2-level cells, i=1)

A single data page occupies the entire same-size physical page, placing one bit per cell. The writing uses the first level (0,1).

Recursive step (double the number of levels)
Increment i
Double the number of cells in the physical page
Place two "copies" of the previous mapping alongside each other.
$2^{i-1}$ additional pages are each mapped to all cells of the physical page.

If the number of levels is not an integer power of 2, construct the mapping for the smallest power of 2 that is greater than this number, but map only the number of pages that utilize the physically existing levels.

EXAMPLE 1 i=2 (4-level cells). In this case, addresses 1 and 2 each occupy half of the wordline, and addresses 3 and 4 are distributed across the whole wordline. The address-to-cells (ATC) mapping on a single wordline is described below:

a. Addresses (data pages) that share a cell should be written to it such that a lower-number address is written no later than a higher-number address. (If a higher-number Address is written, one must not write the lower-number Address.)

b. Addresses (data pages) that share a cell may be written sequentially in Ascending Address order or, alternatively, if all are available, the encoding may be carried out for all of them in that order, and the result that reflects all their values may then be written to the cells.

c. Pages (Addresses) that occupy disjoint sets of cells may be written to concurrently or in any sequential order.

d. Addresses that represent the n'th writing to a given cell may use levels 0, . . . n. For example, writing a page to Address number 5 utilizes levels 0,1,2 because it is the second writing to the cells in which it is stored. They are encoded/decoded using a level-n encoder/decoder.

e. A level-n encoder encodes the data to levels {0, . . . , n} such that all previous and current data can be decoded. (An example of a set of encoders and decoders is provided later.)

f. The charge level of a cell following the n'th writing to it reflects the content of the relevant data of the n data pages whose ATC mapping included that cell.

The actual encoding and decoding functions for the n'th writing to a cell should comply with the above rules. Examples are provided elsewhere in this document.

In the following text, Lemma 1 through Theorem 6, is written corresponding to a fixed number of cells per physical page, said fixed number being equal to the number of bits in a data page. The number of bits in a data page is fixed. Therefore, as one increases the number of levels per cell, MMLP requires the use of a larger number of physical pages for the construction described in Algorithm 1 instead of increasing the number of cells per physical page, as was described there.

Lemma 1 (Gain Example): the average page writing time with 8 levels (3 bits per cell—bpc) using MMLP is: $T_{PROG}=T_1+(2/3)T_2+(1/2)T_3+(1/3)T_4+(1/4)T_5+(1/6)T_6+(1/12)T_7$ Proof: A $5^{th}$ level adds $\log_2(5)-2=0.32$ bpc. Four cells are thus required in order to store an additional bit using the $5^{th}$ level. With 6 and 7 levels, one can store 2.6 bpc and 2.8 bpc, respectively, so with four cells one can add a bit with each additional level up to 8 levels.

As before, different physical pages use different bit lines on a single word line. With k-cell physical pages, 3-bit cells and k-bit data pages, 12 data pages are to be written. The first four pages are written to separate physical pages using levels 0,1 (1 bpc) in time $T_1$. Page 5 (6) is written over the first (remaining) two physical pages using levels 0,1,2 (0.5 bpc) in time $T_1+T_2$ for each. Page 7 (8) is written over the first (remaining) two physical pages using levels 0,1,2,3 in time $T_1+T_2+T_3$ for each. Next, page 9 is programmed over all four pages, i.e., entire wordlines using levels 0,1,2,3,4 (0.25 bpc) in time $T_1+T_2+T_3+T_4$. Each of pages 10,11,12 is similarly written over four pages (0.25 bpc), with each successive data page utilizing one additional level. So, the mean data-page writing time is $T_{PROG}=(12T_1+8T_2+6T_3+4T_4+3T_5+2T_6+T_7)/12=T_1+(2/3)T_2+(1/2)T_3+(1/3)T_4+(1/4)T_5+(1/6)T_6+(1/12)T_7$ This is much shorter than with conventional programming ($T_{PROG}=T_1+T_2+T_3+T_4+T_5+T_6+T_7$), and substantially shorter than with conventional multi-page programming ($T_{PROG}=T_1+(2/3)T_2+(2/3)T_3+(1/3)(T_4+T_5+T_6+T_7)$)

To read a page, the levels of the cells containing it are determined (read), and then decoding takes place. Later-programmed pages in the same MMLP block must first be decoded. The resulting increase in single-page read latency can be mitigated by parallel/pipelined decoding, and throughput does not suffer.

Lemma 2: Consider L'=(L+1)-level cells ($\log_2 L'$ bpc) with $L'=2^n$ where n is natural. Then, with MMLP, a data page may be stored across at most L'/2 physical pages. Other groups sizes of physical page sizes storing a given data page are L'/4, L'/8, . . . , 1.

Proof: Given that information is stored in $\log_2(L')-1$ bits, $L'>2$, the amount of additional available higher charge levels to store additional bit in the cell is $2^{\log(L')}-2^{\log(L')-1}=L'/2$. Each level is storing additional $1/(L'/2)$ bpc. Therefore, the number of cells needed to form one bit is L'/2, and the largest number of physical pages jointly holding a given data page is L'/2. Similarly, given that information is stored in $\log_2(L')-2$ bits, $L'>4$, the amount of levels to store additional bit is $2^{\log(L')-1}-2^{\log(L')-2}=L'/4$ levels. Therefore, data pages are stored in groups of L'/2, L'/4, L'/8, . . . 1 physical pages.

Lemma 3: For any $m \leq L'$, $m=2^n$, n natural, L'/2 data pages are stored across L'/m physical pages.

Proof: By Lemma 2, a data page is stored across at most L'/2 physical pages. The number of data pages that are written using only levels 0,1 is L'/2, and each such page is stored in one distinct physical page. A data page written only using levels 0,1,2 stores 0.5 bpc, and must therefore be written across two physical pages. Since there are L'/2 physical pages, the number of such data pages is (L'/2)/2=L'/4, where each logical page is stored across two physical pages. Similarly, writing using levels 0,1,2,3 also stores 0.5 bpc, so the number of such data pages is also L'/4. The total number of data pages stored across L'/4 physical pages is thus L'/4+L'/4=L'/2. From levels 4 to 7, each data page stores 0.25 bpc, so it must be stored across twice as many physical pages as that used for a 0.5 bpc page. In this case, for each additional level, the number of data pages is (L'/4)/2=L'/8, and each data page is mapped to all four physical pages). The total number of such data pages equals L'/8 times the number of levels in the range 4-7, namely 4·(L'/8)=L'/2. FIG. 3 demonstrates the mapping of logical pages to physical pages for 8-level cells.

FIG. 4 also illustrates (410) a placement of data pages in physical pages with 8-level cells (3 bps). There are 4 physical pages, and the number of cells per physical page equals the number of bits per data page. The first four data pages, P1-P4 are each written using levels 0,1 (as in SLC) into a single distinct physical page. Pages P5-P8 are each written to two physical pages, and each stores 0.5 bpc. Pages P9-P12 are each written across four physical pages, each storing 0.25 bpc per data page.

Generally, from level $2^n$ to $2^{n+1}$, there are $2^n$ levels. The use of each additional level adds $1/2^n$ bpc, so each bit is represented by $2^n$ cells. Since data page size is constant, and the number of cells in a physical page equals the number of bits in a data page, the number of physical pages needed to hold each additional page (using one additional level) is $2^n$. The number of data pages mapped to any given number of physical pages is thus constant and equal to L'/2, the largest number of physical pages across which a data page may be written is L'/2.

Theorem 4: With L'-level cells, at most L logical pages can share a single cell, and the number of logical pages that are each stored across (L'/2) physical pages is $(L'/2)\log_2 L'$.

Proof: According to Lemma 2, a data page is stored across at most L'/2 physical pages, with data pages also stored across L'/4, L'/8, . . . , 1 physical pages. Lemma 3 proves that L'/2 data pages use any given (and allowed) number of physical pages. Therefore, examining L'/2 physical pages, the number of data pages stored across them, Lg, is:

$$Lg = \frac{L'}{2} + 2\frac{L'}{4} + 4\frac{L'}{8} + 8\frac{L'}{16} + \ldots + \frac{L'}{2} \cdot \frac{L'}{L'}$$

$$= \sum_{i=1}^{\log_2 L'} \frac{L'}{2}$$

$$= \frac{L'}{2} \log_2 L'$$

Corollary: The MMLP algorithm is performed on groups of L'/2 physical pages.

Lemma 5: Consider L'-level cells, L'/2 available physical pages, and assume that n levels have been programmed. Then, there are $n/2^{\lfloor \log(n) \rfloor +1}$ logical pages that can be programmed using levels 0,1, . . . , n,n+1.

Proof: By the proof of Lemma 3, from level $2^n$ to $2^{n+1}$ there are $2^n$ levels, which jointly store one additional bpc. Each level is manipulated to store additional $1/2^n$ bpc. Since there are L'/2 available physical pages, and $2^n$ cells are required to represent a bit, there are $(L'/2)/2^n$ data pages for each level between $2^n$ and $2^{n+1}-1$. Namely, given any level n, $(L'2)/2^{\lfloor \log(n) \rfloor} = L'/2^{\lfloor \log(n) \rfloor +1}$ data pages can be written using levels 0,1 . . . ,n,n+1.

Theorem 6: The average page writing time with L' levels per cell ($\log_2 L'$ bpc) using MMLP is $$T_{PROG} = T_1 + \sum_{i=1}^{L'-2} \left[1 - \frac{\lfloor \log_2 i \rfloor}{\log_2 L'} - \frac{i - 2^{\lfloor \log_2 i \rfloor} + 1}{2^{\lfloor \log_2 i \rfloor} \log_2 L'}\right] T_{i+1}.$$

Proof: With incremental breadth-first programming, the general expression for the programming time of n levels is $$T_{PROG} = \sum_{i=1}^{L'-1} \alpha_i T_i,$$

Where $T_i$ is the required time to program from level i-1 to level i, and $\alpha_i$ is determined by the programming algorithm. Our calculation is as follows: we derive the writing duration of $L'/2 \log_2 L'$ data pages, denoted $T_{PROG}'$. In order to get the average program time per page, $T_{PROG}$, we divide by the number of pages. Note that MMLP causes a large variability of page writing time, as discussed further in Sec. IV.

According to Lemma 2, a data page is written across no more than L'/2 physical pages. Hence, when all cells in this group are fully programmed, the number of data pages that were written is $(L'/2) \log_2 L'$. Every programming action may entail the raising of a cell's level from 0, i.e., at least to level 1, so $\alpha_1 = (L'/2) \log_2 L'$. Programming to level 2 or above (which requires raising from 1 to 2) may be brought about by the writing of any data page except for those that were written using only levels 0,1. By Lemma 5, there are L'/2 such pages. Hence, the multiplier $\alpha_2 = (L'/2)\log_2 L' - L'/2$. Programming to level 3 may occur in the writing of any data page except for those that were written using only levels 0,1,2 (or a subset thereof), (L'/2)+(L'/4) pages in total. Therefore, $\alpha_3 = (L'/2) \cdot \log_2 L' - L'/2 - L'/4$. Similarly, $\alpha_4 = (L'/2) \log_2 L' - L'/2 - L'/4 - L'/4$.

Remark: from here onward, the number of cells per physical page varies with the number of levels in a cell, as was assumed prior to Lemma 1.

The choice of which Address (memory cells C) to use for a given data page may also be influenced by considerations such as the frequency of accessing the data. If accessed frequently, we will try to put it in a low Address and refrain from using the higher Addresses of that physical page as long as the space is not required (this permits faster reading). Similarly, if writing of a given page fast is important, we will write it to a low Address. Combining this with the earlier statement regarding the need to write to Addresses in order, the implication of this that we will select the physical page to which to write such that the next Address to be written to it is the one we need.

Encoder 120. Given D, P and an Address (as defined), the encoder transforms the data such that writing the encoded data E into the target cells causes only minimal level changes in them. A page is stored across an address-dependent number of cells, so encoder output has variable length. (The encoder's output is the desired levels of the target cells, reflecting both the new page being written and the existing information in those cells, which is not lost). It is noted that the terms address and Address are used interchangeably, with the meaning clear to any skilled reader based on the context.

Decoder 130. Given E=P (the levels of the cells containing the page being read) and the address, the decoder reconstructs D that was stored in that address. (The address is used to determine the decoder that should be used.)

In each programming operation of a given physical page, we limit the maximum target cell level. Writing the $1^{st}$ (logical) page may only use levels 0 and 1. Writing the $2^{nd}$ page in a cell may only use up to level 2, etc. The encoder, decoder and address-to-cells mapping are determined by the physical and logical page sizes, and by the total number of levels. We next describe the MMLP flow.

MMLP Flow

The pseudo-code of write flow is shown below:

```
1. MMLP write flow (D, Address)
2. C ← ATC(Address)
3. P ← Current levels of memory cells C
4. E ← Encoder(D, P, Address)
5. Write E to memory cells C
6. Update MaxLevel(C) // stored metadata; an optional step
```

In step (1), address determines target cells C. In step (2) C is read from the memory. Next, in step (3) the cell levels P (current content of the target physical page C) along with page data D (data that is to be written) and address are input to the encoder. The encoder transforms the data such that moderate level changes would be made to C's cells. Finally, in step (4) the encoded data E is written to cells C. Note that information is added to the target cells, but the data already stored in them is not lost.

The pseudo-code of read flow is illustrated below:

```
1. MMLP read flow (Address, MaxLevel)
2. C ← ATC(Address)
3. MaxLevel ← ATC-MaxLevel(Address)
4. E ← perform (MaxLevel−1) reference comparisons on cells C
5. D ← Decoder(E, Address)
```

In step (1), the cells to be read C are determined based on the address. In step (2), the maximum level of the pages containing the desired page is read (metadata). In step (3), (MaxLevel-1) reference comparisons are used to determine the cells levels. (These are page-wide reference comparisons, so binary search is irrelevant.) Finally, in step (4), the decoder reconstructs original page D from E and address.

Memory erasure is not affected by MMLP.

We next provide the details of MMLP for 4-level cells and for 8-level cells with 2-bit pages. Larger pages are handled by commensurately increasing the physical page and simply handling every two bits independently in the encoder and in the decoder.

MMLP for 4-Level Cells

We use the following parameters:
a. D (logical page size): 2 bits
b. Wordline (row) contains four cells $\{c_1,c_2,c_3,c_4\}$.
c. There are four addresses for each wordline (physical page). Address-to-cells mapping: ATC(1)=$\{c_1,c_2\}$, ATC(2)=$\{c_3,c_4\}$, ATC(3)=$\{c_1,c_2,c_3,c_4\}$, ATC(4)=$\{c_1,c_2,c_3,c_4\}$.

Figure 2:
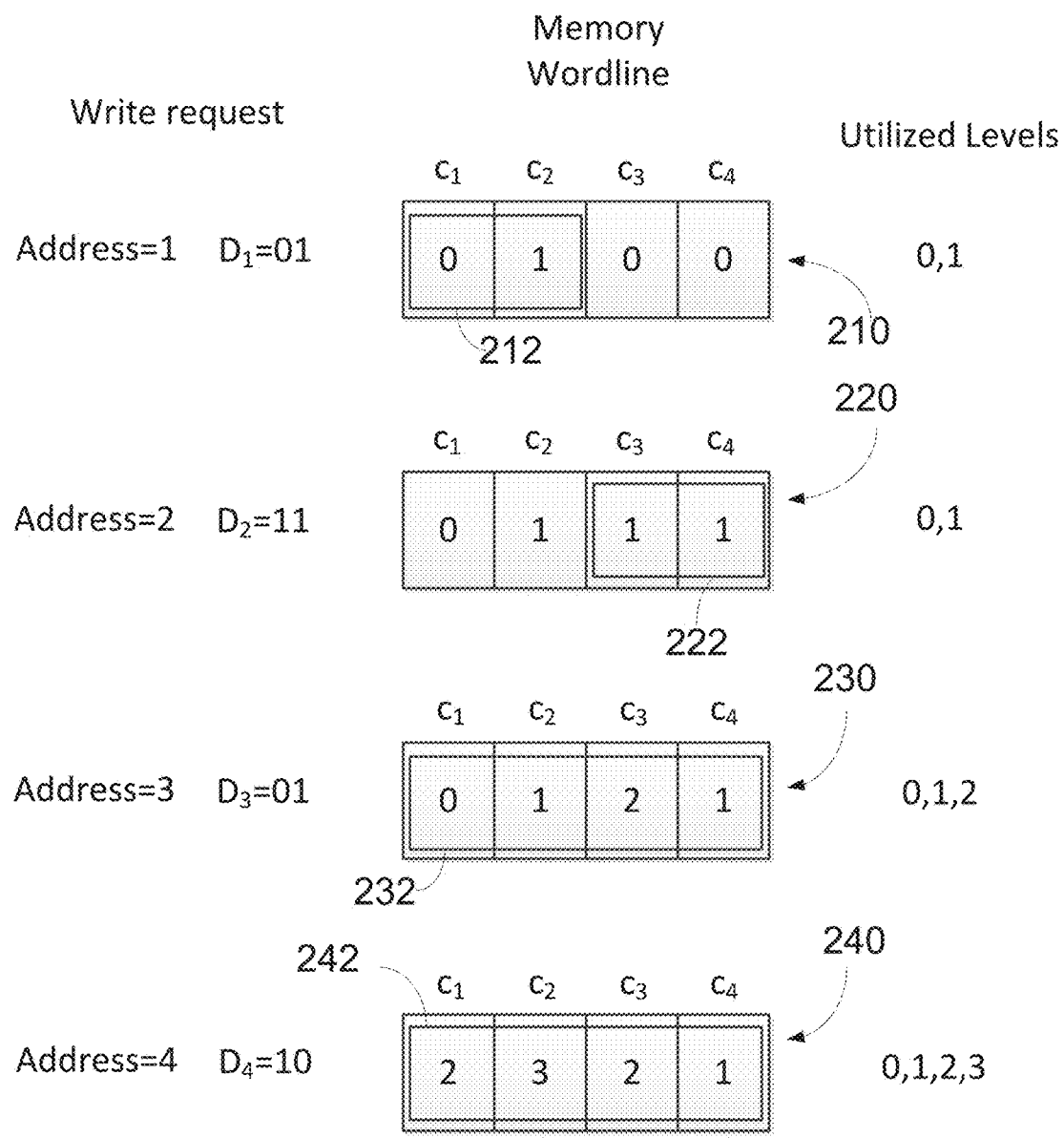
FIG. 2 provides an example of MMLP using 4-level (2-bit) cells and D size of two bits according to an embodiment of the invention.

FIG. 2 provides an example of MMLP using 4-level (2-bit) cells and D size of two bits. Each wordline 210, 220, 230 and 240 has four cells, and can store four logical pages. FIG. 2 shows the mapping of addresses to cells (see frames 212, 222, 232 and 242 respectively), utilized cell levels {0,1}, {0,1}, {0,1,2} and {0,1,2,3} respectively, and cell levels (0100, 0111, 0121 and 2321) following the writing of each page with specific data.

FIG. 3 shows encoding tables 310 and 320 of addresses 3 and 4 (encoder inputs and outputs are given in cell levels). The left column depicts the current cell contents, and the others depict the new cell contents. Note that cell levels are either raised or remain unchanged.

FIG. 2 depicts a 4-level MMLP encoding/decoding table, and FIG. 3 illustrates a specific example of writing four 2-bit pages of data into four 4-level (2-bit) cells.

The first two data pages, $D_1$ and $D_2$, are not encoded. They are stored in distinct cells ATC(1) and ATC(2) (see rectangular frames in FIG. 2). Each bit of the $3^{rd}$ page $D_3$ is mapped to a distinct pair of cells using levels {0,1,2}, and is thus spread across four cells. Finally, each bit of the $4^{th}$ page $D_4$ is again mapped to a distinct pair of cells, this time using levels {0,1,2,3}.

The encoding tables of pages 3 and 4 are given in FIG. 3. The mappings (310 and 320 of FIG. 3) are all injective, and are thus reversible. The following table illustrates a situation in which a first page (page 1) is written before a second page (page 2):

|  | Page 1 data | |
|---|---|---|
| Cell-1/Cell-2 | 0 | 1 |
| 0 - x | 0 - x | 1 - x |

For page 2, assuming it is written after page 1:

|  | Page 2 data | |
|---|---|---|
| Cell-1/Cell-2 | 0 | 1 |
| 0 - 0 | 0-0 | 0-1 |
| 1 - 0 | 1-0 | 1-1 |

Where x stands for 0 or 1, but the same value before and after the subject page is written.

Basically, pages 1 and 2 are written in disjoint cells, and these cells are in the erased state (level 0) prior to the writing.

Also, given an example that refers to the writing of one-bit pages showing what happens to a single bit of a page (which affects one or two cells, depending on page address)—it is noted that for any additional bits of the page, the same thing is done in different cells. So, this can be thought of as displaying the programming a single information bit of each of 4 pages.

Any given cell is affected by three data bits, each from a different logical page (each cell contains a full bit of one page and half a bit of each of two additional pages).

Consider the specific data being stored (FIG. 2). The $1^{st}$-page data is $D_1=01$, and is stored as is in the first two cells (one bit per cell). The $2^{nd}$-page data is $D_2=11$, and is stored as is in the next two cells. The third page data is $D_3=01$. It is encoded to four cells, adding 0.5 bit per cell, using only levels 0,1,2. Prior to writing it, ATC(3) cells are read (P=0111) as their values affect the encoding of the new data. Using the page-3 encoding tables 310 and 320 (FIG. 3), stored data 01 and input data 0 is encoded to 01. Similarly, writing data 1 over the cell pair 11 is encoded to 21, and the cells are programmed to 0121. Page 4 data is $D_4=10$, which encodes to 2321.

Consider reading of an address. The maximum possible cell level, MaxLevel(C), may be known or can be checked via a logarithmic number of reference comparisons (stored metadata). For read of addresses 1 and 2, so long as neither address 3 nor address 4 have been written to, a single reference comparison suffices (the one between levels 0 and 1). Reading addresses 3 and 4 require two and three reference comparisons, respectively.

Data decoding is performed by using the encoding tables in reverse, starting from the last address that was written in C. Reading of 2321 would decode to $D_4=10$ and address 3 levels 0121 (using page 4 encoding table in FIG. 3). Decoding latency consists of combinatorial logic, and is negligible (nano-seconds) relative to reference comparison (tens of micro-seconds). Read is composed of two phases:
1) Reading the cells containing the desired page's information in order to determine their levels.
   This phase is accelerated thanks to fewer reference comparisons:
   In current MLC read schemes, the occupation of cell levels is not known prior to read. Therefore, in N-Levels per cell, N-1 reference comparisons would have to be made in order to determine all cells levels. In contrast, in MMLP we know that in the k-th write to any given cell, only the (k+1) cell levels are occupied. Therefore, given a priori information that k writes were carried out to the set of cells containing a specific data page, we would need only (k+1) reference comparisons.
2) Data Decoding
   The decoding of levels to data can be as simple as reverse mapping of the encoding table. If encoding is more sophisticated (such as a Boolean function) the decoding is the reverse function of encoding.

8-Level Cells MMLP

Consider 8-level (3-bit) cells, also known as "TLC". FIG. 4 depicts the ATC, mapping 400 of twelve data pages into a single physical page, as well as the utilized levels after programming each page. The first four addresses (pages) are mapped to distinct cells, with one bit per cell, so no encoding is required.

ATC(1)-ATC(4) are written using levels $\{0, 1\}$. ATC(5)-ATC(6) are written using levels $\{0, 1, 2\}$. ATC(7)-ATC(8) are written using levels $\{0, 1, 2, 3\}$. ATC(9), ATC(10), ATC(11) and ATC(12) are written using levels $\{0, 1, 2, 3, 4\}$, $\{0, 1, 2, 3, 4, 5\}$, $\{0, 1, 2, 3, 4, 5, 6\}$ and $\{0, 1, 2, 3, 4, 5, 6, 7\}$ respectively.

Addresses 5-8 are each mapped to twice as many cells as page size, so each cell stores an additional 0.5 bit of each page (a pair of cells stores an additional bit). Similarly, an address in the range 9-12 has 0.25 bit stored in each cell.

Encoding tables for 8-level cells are omitted for brevity. Instead, we next show that such an encoding exists.

Proposition 1: An encoding per FIG. 4 exists; i.e., one requiring at most a single additional level per page write.

Proof: In the first four pages, each bit is programmed in a single cell using levels 0,1. When allowing only three levels 0,1,2, each cell can store $\text{Log}_2(3)=1.585$ bits. Therefore, each pair of cells can store 3 bits—the two bits of the previous page and one bit of page 5 or 6. Similarly, when allowing first n levels, each cell can store $\text{Log}_2(n)$ bits. We multiply the number of cells until data page can be added on top of previously programmed pages. This approach can be generalized to any number of levels per cell.

In summary, MMLP has only a small fraction of data pages programmed to high levels, thereby accelerating the writing of most pages as well as their reading so long as subsequent pages have not been written. Yet, full storage capacity is utilized without redundancy. We next turn to quantify the benefits.

Remark. MMLP assumes that addresses are programmed in order. (This refers to the actual physical pages. It has no logical implications, given the use of mapping tables.)

Figure 9:
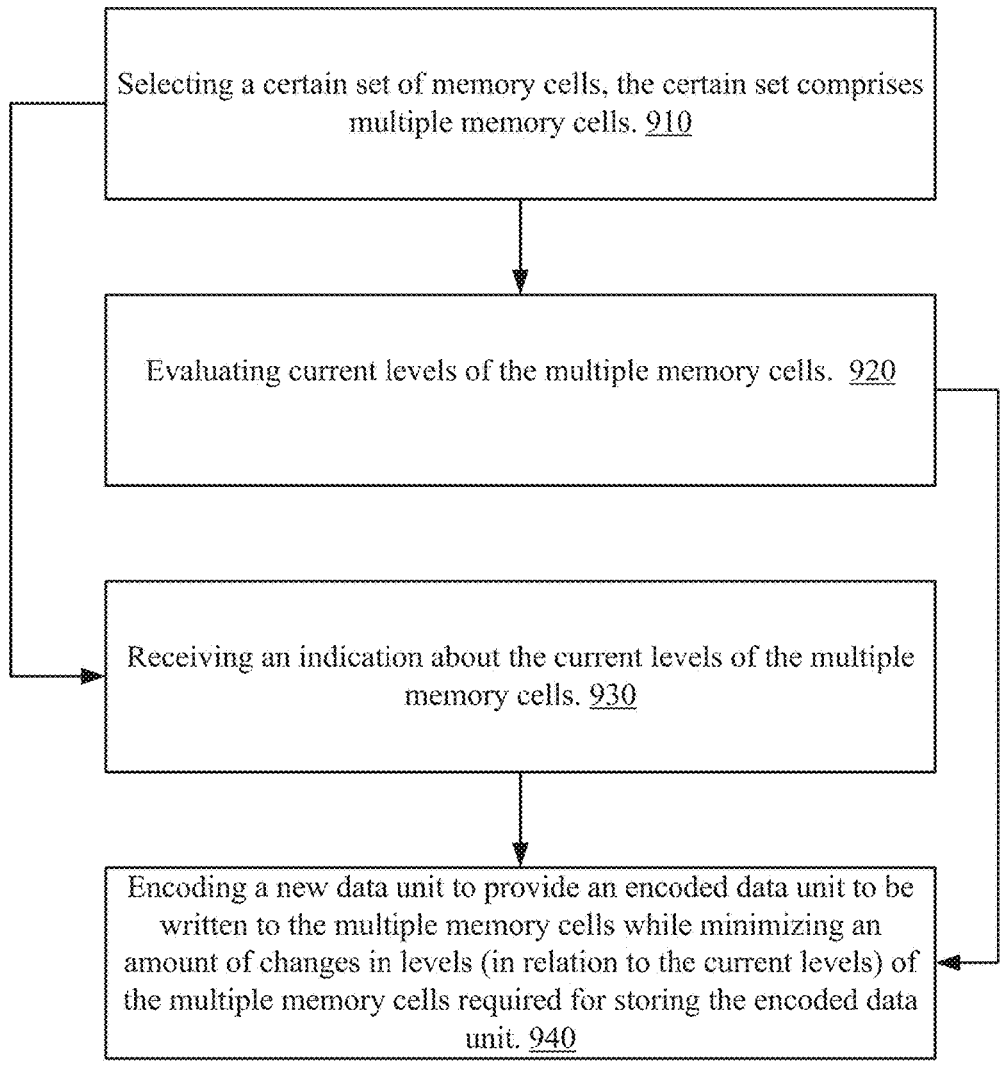
FIG. 9 illustrates a method according to an embodiment of the invention.

FIG. 9 illustrates method 900 according to an embodiment of the invention.

Method 900 may start by stage 910 of selecting a certain set of memory cells, the certain set comprises multiple memory cells.

Stage 910 may be followed by stage 920 or stage 930. Stage 920 may include evaluating current levels of the multiple memory cells. Stage 930 may include receiving an indication about the current levels of the multiple memory cells. Stages 920 and 930 may include reading the content of the multiple cells.

Stages 920 and 930 may be followed by stage 940 of encoding a new data unit to provide an encoded data unit to be written to the multiple memory cells while minimizing an amount of change in levels (in relation to the current levels) of the multiple memory cells required for storing the encoded data unit. The minimization can be responsive to programming time and energy consumption. The minimizing can include minimizing the sum of changes and/or minimizing the maximal level among the cells containing the data page being written.

Stage 930 may be followed by stage 940 of writing the encoded data unit to the multiple memory cells. Stage 940 may also include updating metadata such as the maximum level of the multiple memory cells.

Stage 940 may include applying the decoding so that a $k^{th}$ writing of a data bit to a memory cell comprises utilizing only a lowest (k+1)'th levels of the memory cell.

Figure 10:
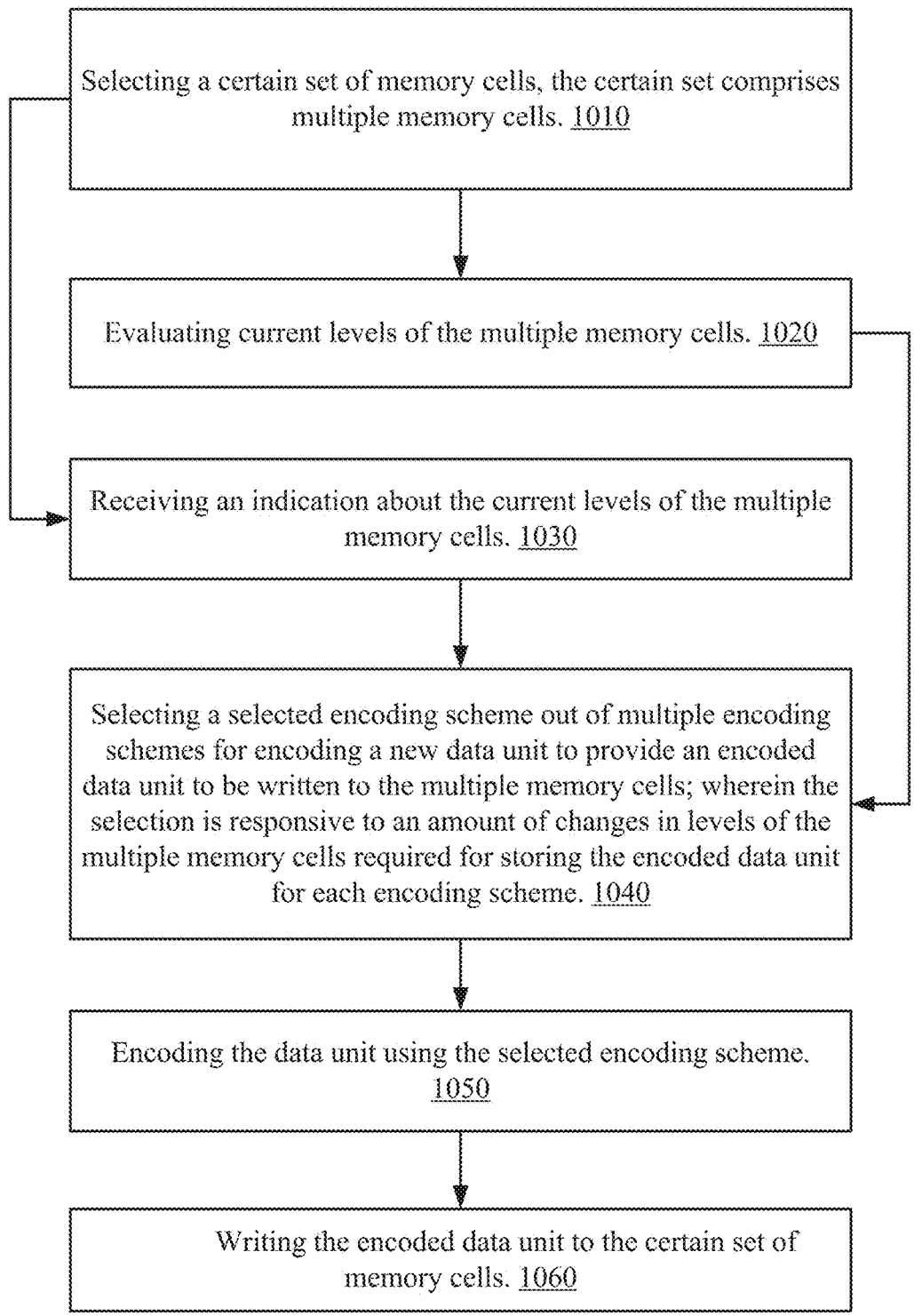
FIG. 10 illustrates a method according to an embodiment of the invention.

FIG. 10 illustrates method 1000 according to an embodiment of the invention.

Method 1000 may start by stage 1010 of selecting a certain set of memory cells, the certain set comprises multiple memory cells.

Stage 1010 may be followed by stage 1020 or stage 1030. Stage 1020 may include evaluating current levels of the multiple memory cells. Stage 1030 may include receiving an indication about the current levels of the multiple memory cells. Stages 1020 and 1030 may include reading the content of the multiple cells.

Stages 1020 and 1030 may be followed by stage 1040 of selecting a selected encoding scheme out of multiple encoding schemes for encoding a new data unit to provide an encoded data unit to be written to the multiple memory cells;

wherein the selection is responsive to an amount of changes in levels of the multiple memory cells required for storing the encoded data unit for each encoding scheme. Stage 1040 may include write metadata that is indicative of the selected encoding scheme.

Stage 1040 may be followed by stage 1050 of encoding the data unit using the selected encoding scheme.

Stage 1050 may be followed by stage 1060 of writing the encoded data unit to the certain set of memory cells.

Stage 1040 may include selecting the encoding scheme that is expected to cause a lowest amount of changes in the levels of the multiple memory cells.

Stage 1050 may include applying the selected encoding scheme so that a $k^{th}$ writing of a data bit to a memory cell comprises utilizing only a lowest (k+1)'th levels of the memory cell.

Figure 11:
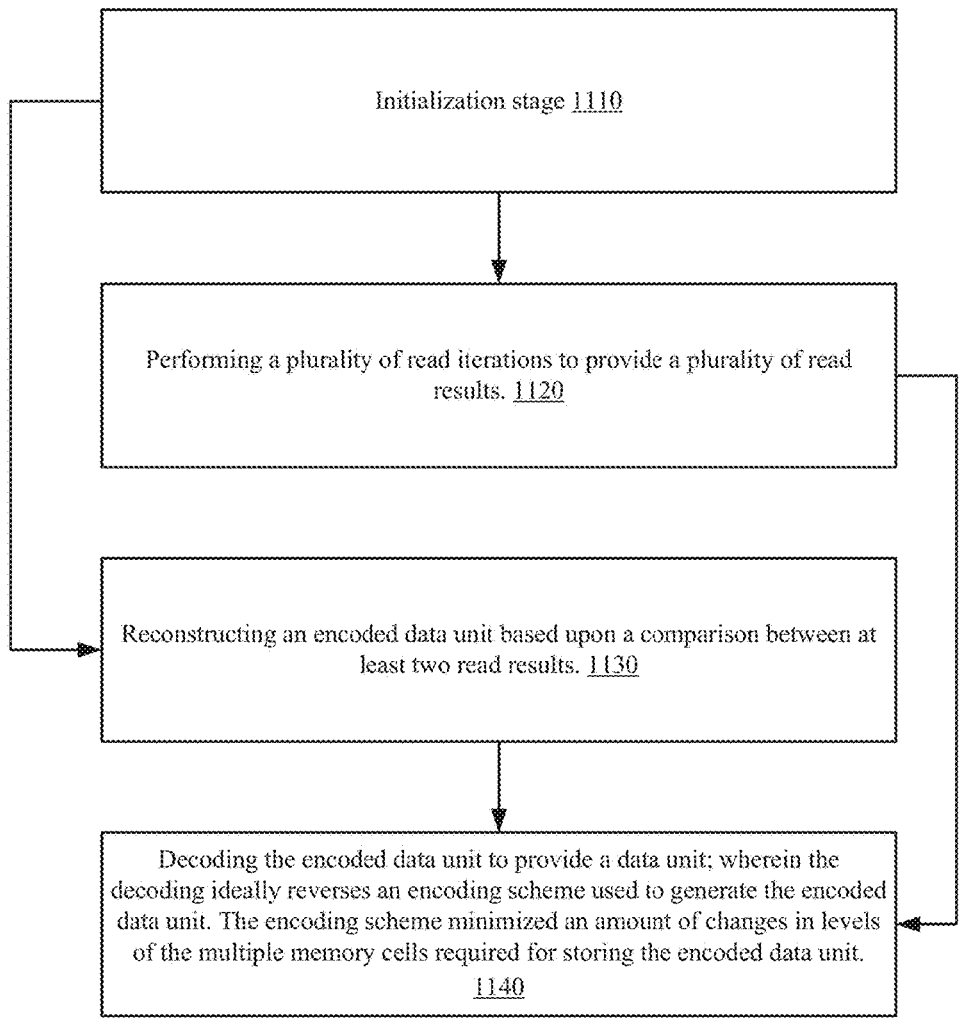
FIG. 11 illustrates a method according to an embodiment of the invention.

FIG. 11 illustrates method 1100 according to an embodiment of the invention.

Method 1100 may start by an initialization stage 1110.

Stage 1110 may include receiving an indication about a maximal utilized level of multiple memory cells that belong to a certain set of memory cells or evaluating the maximal utilized level; and determining a required amount of the plurality of read iterations based upon the maximal utilized level.

Stage 1110 may be followed by stage 1120 of performing a plurality of read iterations to provide a plurality of read results.

Stage 1120 may be followed by stage 1130 of reconstructing an encoded data unit based upon a comparison between at least two read results.

Stage 1130 may be followed by stage 1140 of decoding the encoded data unit to provide a data unit; wherein the decoding ideally reverses an encoding scheme used to generate the encoded data unit. The encoding scheme minimized an amount of changes in levels of the multiple memory cells required for storing the encoded data unit.

Figure 12:
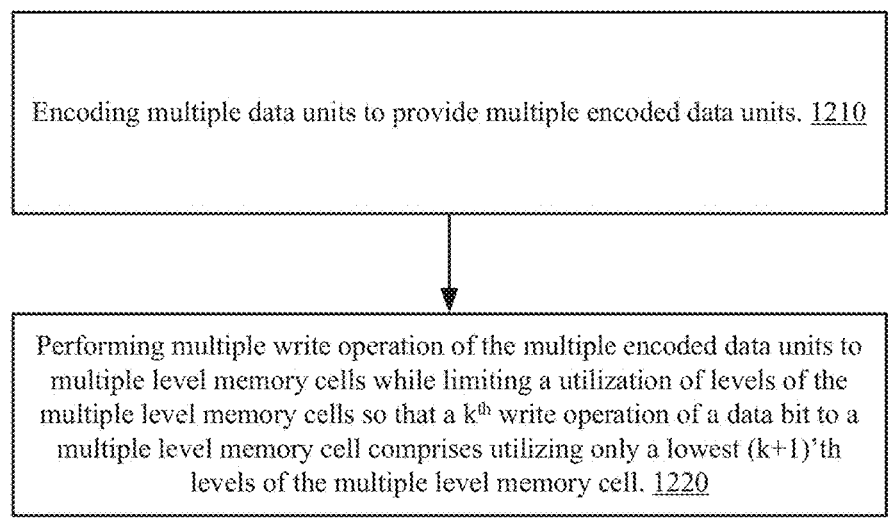
FIG. 12 illustrates a method according to an embodiment of the invention.

FIG. 12 illustrates method 1200 according to an embodiment of the invention.

Method 1200 may start by stage 1210 of encoding multiple data units to provide multiple encoded data units.

Stage 1210 may be followed by stage 1220 of performing multiple write operation of the multiple encoded data units to multiple level memory cells while limiting a utilization of levels of the multiple level memory cells so that a $k^{th}$ write operation of a data bit to a multiple level memory cell comprises utilizing only a lowest (k+1)'th levels of the multiple level memory cell. It is noted that stage 1220 may include writing of a single bit to at least one cell, as a bit worth of information may be spread across multiple cells (pages 3 and 4 in the earlier example).

The method may use fewer levels if the count is by address, because, for example, the first two (or 4) pages are written to disjoint sets of cells, utilizing only levels 0 and 1. The rule is precise when counting by the number of writings to the same cell. The first writing of data to a cell may only use levels 0 and 1, the $2^{nd}$ may only use up to level 2, etc.

Evaluation

This section quantifies the performance of MMLP for 4-level Flash cells: write latency, read latency and energy consumption. A VLSI design then serves for overhead estimation. Trace-based and PCM evaluations are in Appendix.

Parameter Values and Basic Expressions

Program and read time comprise the required time to raise a cell's level from i to j, $Tp_{i \to j}$, and to sense the cell's voltage and compare it with a reference value. $Tp_{i \to j}$ equals the number of required pulses, $Np_{i \to j}$, times the sum of the durations of the program pulse ($T_{pulse}$) and the subsequent verification ($T_{vfy}$):

$$Tp_{i \to j} = Np_{i \to j}(T_{pulse} + T_{vfy}) \quad (1)$$

Table 2 provides numbers based on reported measurements [4].

Address multiplexing delay is some 1000x smaller than program and verify times, so it is omitted.

TABLE 2

| Parameter | Value |
| --- | --- |
| $Np_{0 \to 1}$ | 10 [pulses] |
| $Np_{0 \to 2}$ | 20 [pulses] |
| $Np_{0 \to 3}$ | 40 [pulses] |
| $Np_{1 \to 2}$ (=$Np_{0 \to 2}$-$Np_{0 \to 1}$) | 10 [pulses] |
| $Np_{1 \to 3}$ (=$Np_{0 \to 3}$-$Np_{0 \to 1}$) | 30 [pulses] |
| $Np_{2 \to 3}$ (=$Np_{0 \to 3}$-$Np_{0 \to 2}$) | 20 [pulses] |
| $T_{pulse}$ | 10 [μSeconds] |
| $T_{vfy}$ | 10 [μSeconds] |

Table 2 illustrates experimental parameters [4]. $Np_{i \to j}$ denotes the required number of pulses for raising a cell from level i to j. $T_{pulse}$ and $T_{vfy}$ are the durations of program pulse and single reference comparisons.

The time required for read ($T_{read}$) equals $T_{vfy}$ times the required number of reference comparisons $N_r$:

$$T_{read} = Nr \cdot T_{vfy} \quad (2)$$

Write Latency

We derive this for MMLP, and compare it with prior art: Conventional and Multi-Page programming techniques.

In Conventional Programming (CP) [11], all cells destined for level ≥1 are first programmed to level 1. Then, all cells destined for ≥2 are programmed to level 2, etc. One verification step follows each program pulse. Page write latency is:

$$T_{CP} = (Np_{0 \to 1} + Np_{1 \to 2} + Np_{2 \to 3})(T_{pulse} + T_{vfy}) \quad (3)$$

In Multipage Programming (MP) [8], each cell stores one bit of each of two pages. The level-to-values mapping: 0↔11, 1↔10, 2↔00, 3↔01. The $1^{st}$ page sets the least significant bit (levels 0 and 1). The $2^{nd}$ page sets the most significant bit utilizing concurrent programming (see Appendix) to levels 2,3 with two reference comparisons. Prior to $2^{nd}$ page programming, MP reads the cells (one reference comparison) in order to retain the correct LSB value.

The programming time of the $1^{st}$ page is $Np_{0 \to 1}(T_{pulse} + T_{vfy})$; that of the subsequently written $2^{nd}$ page is $T_{readmp} + \max\{Np_{0 \to 3}, Np_{1 \to 2}\}(T_{pulse} + 2T_{vfy})$. The mean (over pages) write time is:

$$T_{MP} = 1/2(Np_{0 \to 1}(T_{pulse} + T_{vfy}) + T_{readmp} + + \max\{Np_{0 \to 3}, NP_{1 \to 2}\}(T_{pulse} + 2T_{vfy})) \quad (4)$$

In MMLP, each cell is shared among four pages. It is the maximum possible parallelism with 4 levels. Writing each of the $1^{st}$ two pages takes $Np_{0 \to 1}(T_{pulse} + T_{vfy})$. The $3^{rd}$ page has level transitions 0→1, 0→2, and 1→2 (FIG. 3), and cells are read $T_{readp2}$ prior to program, taking $T_{readp2} + \max\{Np_{0 \to 1}, Np_{0 \to 2}, Np_{1 \to 2}\}(T_{pulse} + 2T_{vfy})$. The $4^{th}$ page has level transitions 0→2, 1→3 and 2→3 (FIG. 3), and read $T_{readp3}$ prior to program, taking $T_{readp3} + \max\{Np_{0 \to 2}, Np_{1 \to 3}, Np_{2 \to 3}\}$ ($T_{pulse}+2T_{vfy}$). The read $T_{readp2}=1 \cdot T_{vfy}$ prior to $3^{rd}$ page program requires one comparison. The $T_{readp3}=2 \cdot T_{vfy}$ prior to $4^{th}$ page has two comparisons. The average (over pages) page writing time is:

$$T_{MMLP} = \frac{1}{4}(2Np_{0\to1}(T_{pulse} + T_{vfy}) + T_{readp2} + \qquad (5)$$
$$T_{readp3} + \max\{Np_{0\to1}, Np_{0\to2}.Np_{1\to2}\}(T_{pulse} + 2T_{vfy}) +$$
$$\max\{Np_{0\to2}, Np_{1\to3}, Np_{2\to3}\}(T_{pulse} + 2T_{vfy}))$$

TABLE 3

| Architecture | Page Write Latency [μS] 4-level cells | Average Write Latency [μS] 4-level cells |
|---|---|---|
| Conventional | All pages: 800 | 800 |
| Multi-page | $1^{st}$ page: 200 | 705 |
|  | $2^{nd}$ page: 1210 |  |
| MMLP | $1^{st}$ page: 200 | 482.5 |
|  | $2^{nd}$ page: 200 |  |
|  | $3^{rd}$ page: 610 |  |
|  | $4^{th}$ page: 920 |  |

Table 3 illustrates the write latency for MMLP and prior art (Conventional, Multipage); 4-level cells.

Results (Table 3). MMLP achieves 40% and 32% reduction in average program latency (speedup of ×1.65 and ×1.5) over Conventional and MP. For more levels, the gap increases; E.g., a 56.75% reduction relative to MP for 8-level (3-bit) cells.

Read Latency

Read latency depends on the number of utilized levels, so it varies with capacity utilization. When all levels are utilized, the read latency is similar for all methods: $T_{read}=3T_{vfy}$. When computing averages, we assume that the low levels of all physical pages are used before beginning to use higher levels.

In Conventional Reading, three reference comparisons are used without considering level utilization.

With Multipage, for utilization of up to 50%, $T_{read}=T_{vfy}$. Beyond that, any page uses all levels, so $T_{read}=3T_{vfy}$.

With MMLP, for utilization of up to 50%, $T_{read}=T_{vfy}$. Each page that is programmed between 50% to 75% capacity uses levels (0,1,2), and reading it requires 2 reference comparisons $T_{read}=2T_{vfy}$. Beyond that, any page uses all levels, so $T_{read}=3T_{vfy}$.

Once a "later" page (higher address in the same physical page) uses a high level, the larger number of comparison is also required when reading an "earlier" page.

MMLP's relative reduction in the number of required reference comparisons grows as the number of levels increases. FIG. 5 includes graph 500 and curves 510, 520, 530 and 540 that depict read latency vs. memory occupancy for 4- and 8-level MMLP (curves 540 and 520 respectively) and Multipage techniques (curves 530 and 510).

MMLP is as fast as Multipage in some occupancy ranges, and significantly faster in others. E.g., with 4-level cells, for 50%-75% occupancy, MMLP is 1.5× faster than Multipage (20 μs vs. 30 μs).

Finally, MMLP increases the number of cells accessed in parallel to the maximum possible. In some NAND Flash array designs, the wordline length has to be extended while commensurately shortening the bitline to keep a fixed number of cells. So doing further reduces read latency due to reduced bitline precharge and discharge duration. Program time is not affected by wordline extension, since program pulse duration is several magnitudes longer than wordline signal propagation (micro-seconds vs. nano-seconds). The above analysis did not incorporate this additional advantage, and is thus conservative.

Trace-Based Evaluation

We estimate the expected performance of MMLP relative to Conventional and Multipage for actual I/O traces, using storage traces from PC-MARK [12]. See Table 4 in the appendix for trace descriptions.

Our methodology is as follows. First, we use our previously obtained analytical results to express speedup vs. R/W ratio for a given set of parameter values. Next, for each trace, we count the numbers of reads and writes to obtain its R/W ratio. Finally, we use the analytical results for that R/W ratio as our estimate.

Consider 4-level-cell NAND Flash. With Conventional, write is 18× slower than read (900 μs vs. 50 μs). Write energy consumption ranges between 10× and 630× of read [4]. In our comparison, we assume write power to be 2× that of read (for all schemes), which matches most of the samples in [4].

MP's wordlines are 2× longer and bitlines are 2× shorter than Conventional [8],. This becomes 4× for MMLP due to increasingly parallel cell access. Write time is unaffected, but read duration is reduced commensurately due to reduced bitline precharge and discharge times during reference comparison.

Results show that MMLP's advantage over Multipage to be 1.5×-2× in performance, and 2×-2.7× in energy consumption. Evaluation details are given in the appendix.

VLSI Implementation and Overhead

MMLP comprises encoder, decoder, and address-to-cell mapping modules, and a small table storing MaxLevel(C) for each group of pages. We implemented the modules in Verilog HDL, and synthesized them with Synopsis Design Compiler in IBM 65 nm process technology. The latency of each module is about 0.5 ns in 65 nm technology, which is negligible relative to write/read latency. MMLP's circuit area is 625 μm², 0.003% of a typical 144 mm² die. Total power consumption, including leakage and dynamic power is 584 μWatt, nearly 1% of a typical 50 mW average program power. Overhead, both latency and area, is thus negligible.

Energy Savings

The reduction in write/read latency leads to corresponding energy savings. A typical MLC Flash has power consumption of 50 mW for write and 30 mW for read. While read energy reduction depends on memory occupancy, write energy reduction is expressed when writing any erased block. With 4-level cells, energy savings relative to Multipage is 32%-50%.

ERROR HANDLING and ENDURANCE

Flash data errors are characterized as low-magnitude shifts, which cause the level of a cell to change to an adjacent level. They are often caused by continuous charge leakage or program overshoots.

Due to the storage of partial bits per cell, a reduction of a cells level by one may result in multiple data bit errors. Nonetheless, any given cell is affected by at most one bit of any given page, so at most one error may result in each data page.

The data of any given page can be protected using well known ECC. Also, assuming that no errors occurred until the final page was written to a given physical page, ECC that protects the cell states following the writing of the final page will guarantee correct decoding of all pages. Thus, all pages but the last can be programmed without ECC protection, and the last page is programmed with ECC, thereby reducing the required amount of ECC redundancy There is provided a MMLP—minimal maximum level programming, a memory architecture that enhances write and read performance while saving energy in MLC memory. MMLP Minimizes the mean page-writing time, shortening it by at least 32% relative to prior art for 4-level cells. Whenever the memory is underutilized, Read is accelerated by reducing the amount of reference comparisons, based on a priori knowledge of the highest programmed level in a page.

MMLP results in variability of write/read time between pages. Exploiting this for performance optimization is a topic for future research. Additional research directions include low-complexity encoding/decoding for a large number of levels, combination with ECC, and further combination with high-speed programming techniques.

Our focus here has been on NAND Flash, with an outline of adaptation to Phase-Change memory in the appendix. However, MMLP may be beneficially adaptable to additional memory technologies.

Appendix-Trace-Based Evaluation

In this section, we estimate the expected performance of MMLP relative to Conventional and Multipage for actual I/O traces. We use storage traces from PC-MARK [12]. See Table 4 for trace descriptions.

Methodology

The speedup in average memory access time is given by:

$$\text{Speedup} = \frac{N_R T_R^{Old} + N_W T_W^{Old}}{N_R T_R^{New} + N_W T_W^{New}} \quad (6)$$

Where:

$N_R$, $N_W$—Numbers of read and write requests.
$T_R^{Old}$, $T_W^{Old}$—Conventional durations.

The energy reduction factor (larger is better) is given by:

$$ER = \frac{N_R P_R^{Old} T_R^{Old} + N_W P_W^{Old} T_W^{Old}}{N_R P_R^{New} T_R^{New} + N_W P_W^{New} T_W^{New}} \quad (7)$$

Where:

$P_R^{Old}$, $P_W^{Old}$—Read and write power of Conventional.
$P_R^{New}$, $P_W^{New}$—Read and write power of MP or MMLP.

$T_R^{New}$, $T_W^{New}$—The duration of read and write in multipage or MMLP architectures, as summarized in Table 3, with adjustment to 2×/4× shorter bitline.

We assume that the memory occupancy is almost 100%. Therefore, read acceleration due to reduced reference comparison is not expressed, and read is accelerated only through shorter bitline. Lower memory occupancy would result in greater speedup and energy reduction.

Figure 8A:
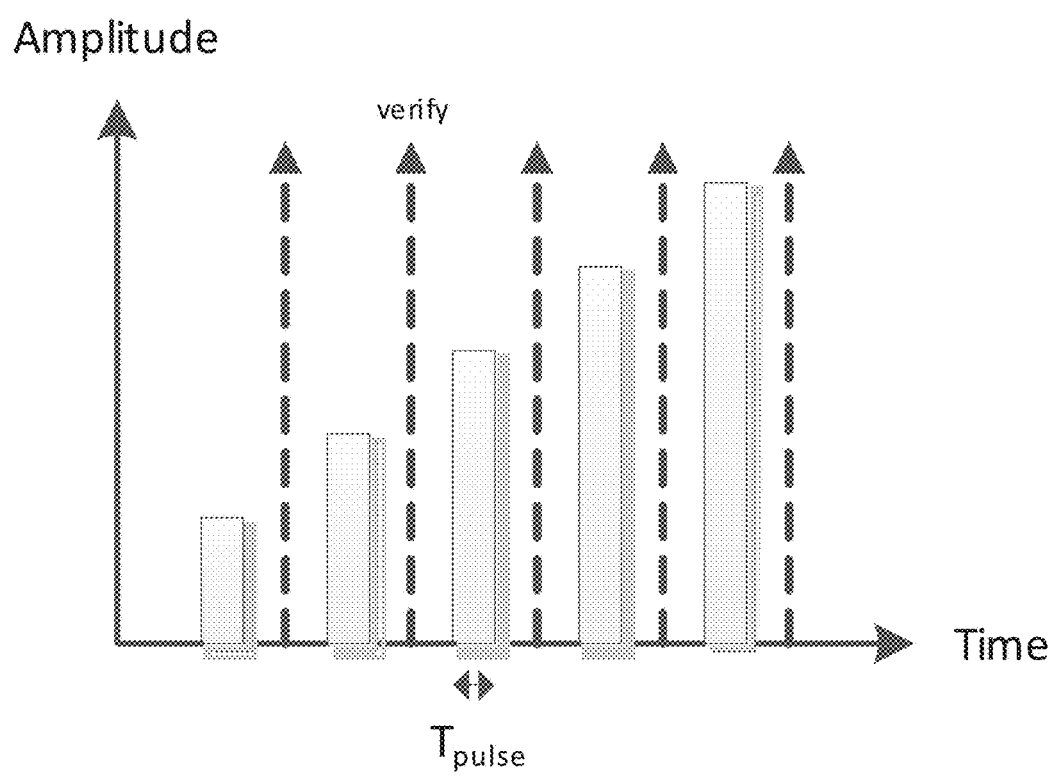
FIGS. 8A-8C illustrate pulse duration and magnitude in Flash and PCM MLC programming.
Figure 8B:
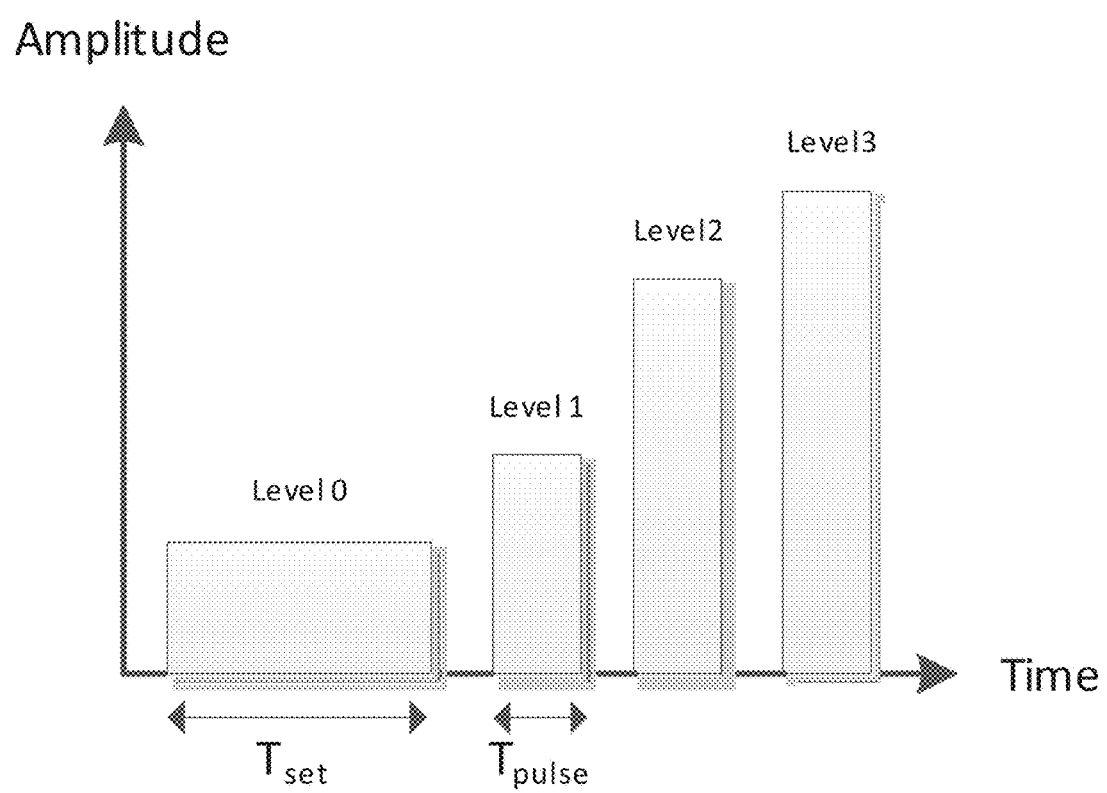

FIGS. 8A-8B depict speedup and energy vs. R/W ratio, showing the location of each trace on the curve based on its R/W ratio.

We did not perform circuit-level simulations, as their results depend on highly supplier-dependent manufacturing parameters [3, 4]. Our relative-gain approach is efficient and sensible, as our focus is on the Flash memory rather than on overall system performance, which affected by other things.

Array-Level and Wordline/Bitline Implications. MMLP increases the number of cells that may be accessed in parallel in order to write (or read) a given data page. This by itself is of little value, because commensurately more cells must be accessed in order write or read a data page. However, as pointed out for Multipage [8], the ability to meaningfully lengthen the wordline (so as to increase the number of bitlines and access all cells in parallel) permits a commensurate shortening of the bitlines. Shortening a bitline reduces its capacitance, permitting faster read access. In other words, this accelerates reading, as well as the verification step when writing. The available on-chip parallelism is thus put to good use in order to expedite access to even a single data page.

Delay and Energy Parameters. Both programming and reading of Flash/PCM occur as a sequence of discrete steps (program pulses+verification for write, and reference comparisons for Read). Both latency and energy are linear in the number of steps, and their relative values are largely independent of circuit parameters. Therefore, our evaluation is relative to Conventional and Multi-page architectures. We must nonetheless use actual time values to determine the relative weights for read and write.

Results. In FIG. 8, one can see a dramatic advantage of both MP and MMLP over Conventional, which becomes more pronounced as the number of levels per cell increases. The gap between MMLP and MP grows as R/W ratio increases, expressing the fact that the indirect benefit of shortening the bitlines is apparently very substantial. MMLP performance advantage over Multipage ranges from 1.5× to 2× in performance, and from 2× to 2.7× in energy consumption.

Phase-Change Memory (PCM)

In this section, we assess the benefits of MMLP to PCM programming, after a brief review of its salient features.

PCM Programming

PCM can be changed on a bit basis, unlike Flash that has to be block erased [13]. The programming algorithm of MLC PCM includes program pulses and also read verify in some cases, similarly to Flash. The programming duration of MLC PCM depends on the cell's current level. As in Flash, the impact of a given program pulse on different cells may vary, both due to process variation and to the cell's current state. When programming many cells concurrently, the worst case is likely to exist and determines the latency.

Figure 8C:
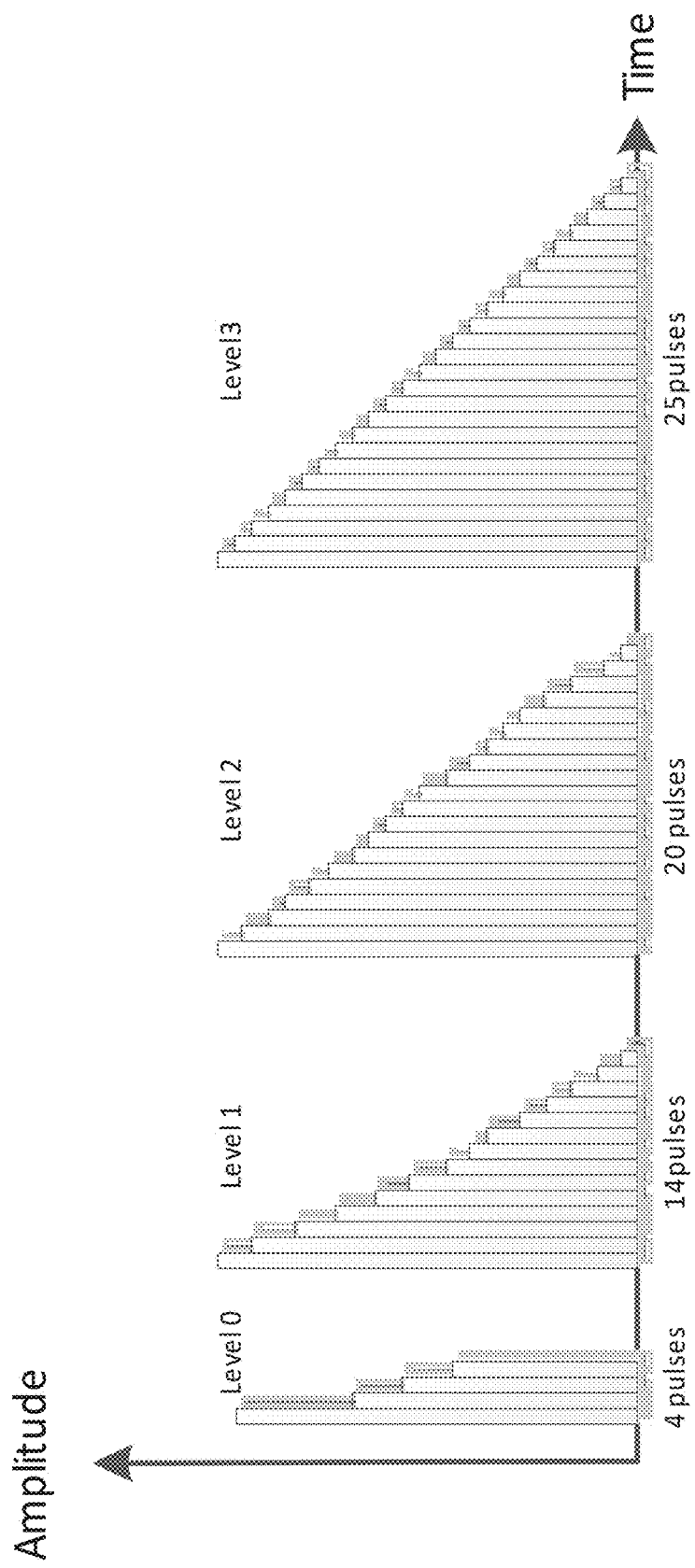

MLC PCM programming is usually either "RESET to SET" (R2S) or "SET to RESET" (S2R) [14] (FIGS. 8A-8C). In S2R, an initial reset pulse is applied, bringing the cell to its lowest level, and subsequent programming pulses raise its level. Similarly, S2R comprises an initial set pulse that raises the cell to its maximum level, and subsequent pulses lower the level to the target one. S2R and R2S exhibit a speed-reliability trade-off. While S2R is faster than R2S, the margin between adjacent levels is lower, making S2R more error prone. Therefore, R2S is more common. Prior to writing, it has been proposed to perform data read [15] in order to avoid additional pulses to cells that already contain data. However, the benefit of so doing when programming an entire page is questionable because the worst case (over cells) matters, and at least one cell is likely to require the full swing.

TABLE 4

Table. 4. Storage traces.

| Trace | Description |
|---|---|
| windefend | Windows defender |
| gaming | Playing a game |
| Imppict | Importing pictures |
| Vistastart | Windows Vista start |
| videdit | Video Editing |
| medcent | MS media center |
| medplayer | Playing music |
| Appload | Application loading |

Figure 6A:
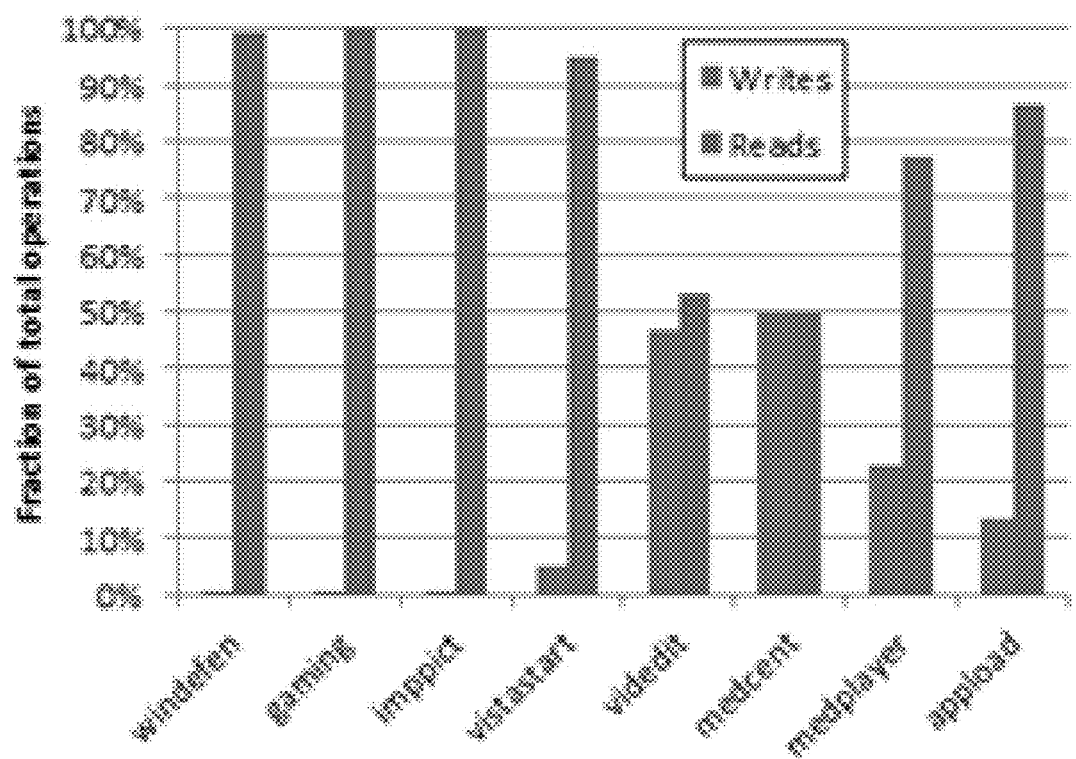
FIG. 6A illustrates read and write fraction out of total benchmark operations and FIG. 6B illustrates read and write duration fraction out of total runtime according to an embodiment of the invention.
Figure 6B:
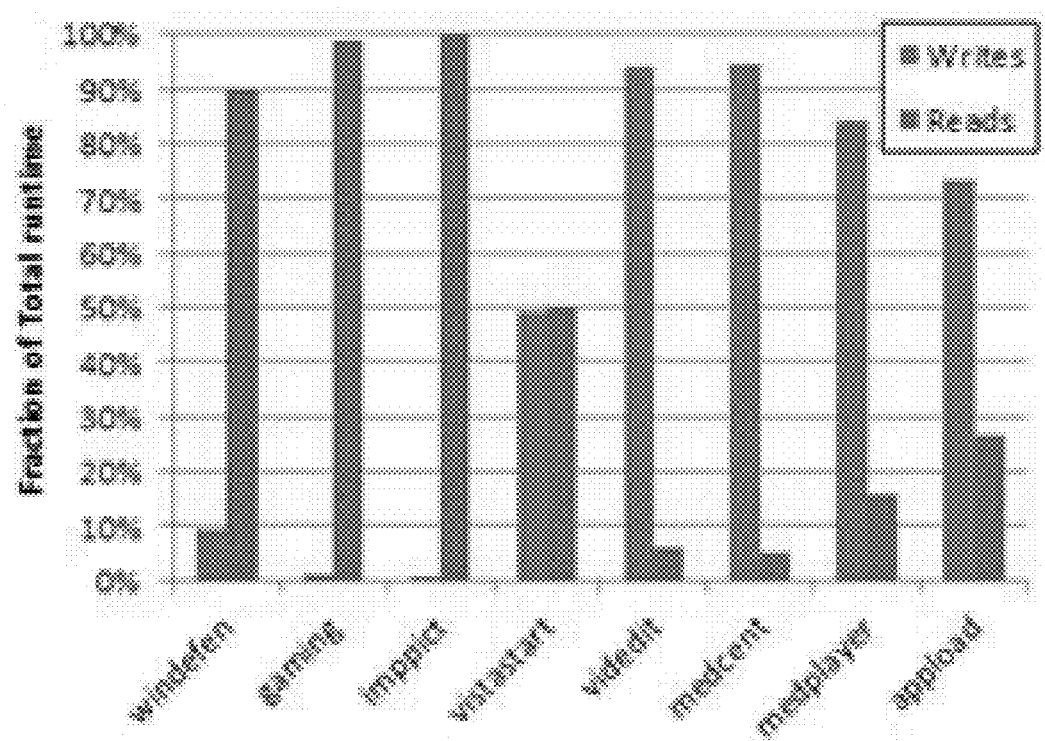

FIG. 6A includes graph 610 that illustrates read and write fraction out of total benchmark operations and FIG. 6B includes graph 620 that illustrates read and write duration fraction out of total runtime. Write is 18× slower than read.

Figure 7A:
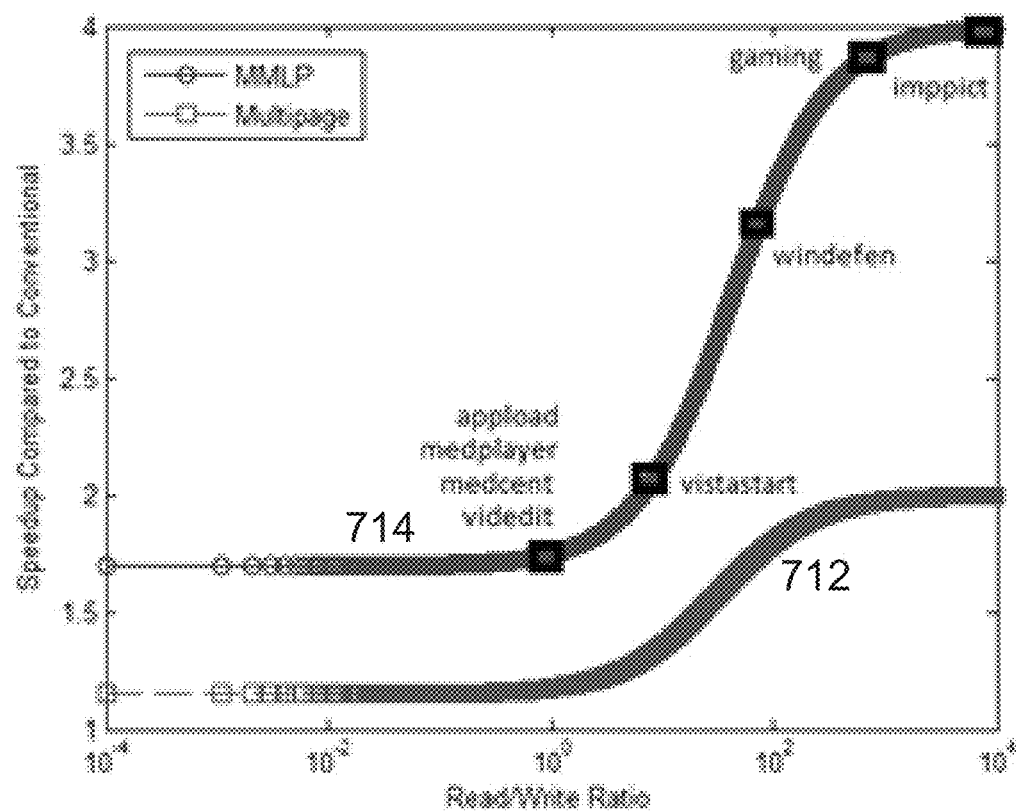
FIG. 7A illustrates a speedup and FIG. 7B illustrates an energy reduction of Multipage and MMLP according to an embodiment of the invention relative to Conventional vs. R/W ratio.

FIG. 7A includes graph 710 that illustrates a speedup of Multipage and MMLP (curve 714) relative to Conventnional vs. R/W ratio (curve 712).

Figure 7B:
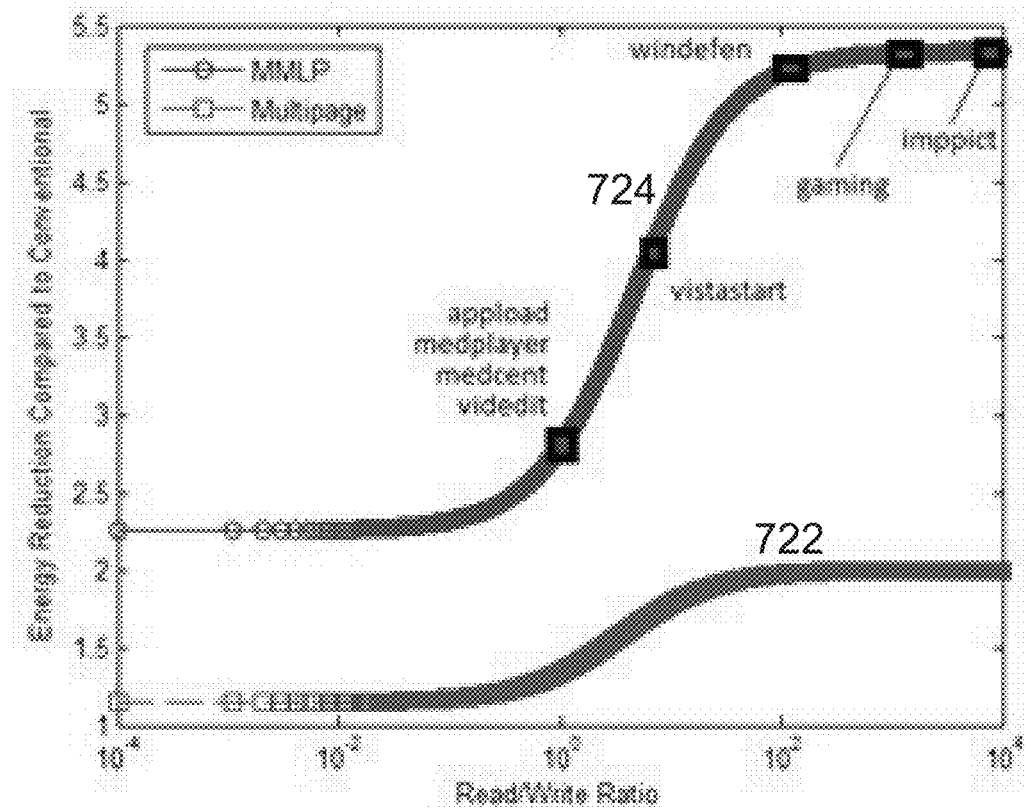

FIG. 7B includes graph 720 that illustrates an energy reduction of Multipage and MMLP (curve 724) relative to Conventnional vs. R/W ratio (curve 722). Benchmarks are placed based upon their R/W ratio. (baseline write is 18× slower than read, and consumes 2× power than read).

Further PCM programming optimization schemes include pulse optimization [16, 17], mapping [18] and write suspension [19]. Pulse optimization can complement MMLP and enhance it. Write suspension and cancellation can mitigate the write bottleneck by using additional buffers, but are limited to buffer size and can cause data loss in the event of power failure.

PCM Programming Latency

Tables 5 and 6 provide typical timings for R2S and S2R, respectively [14]. Program time to high level includes the programming to initial and intermediate levels.

Let $Tp_{i \to j}$ denote the program time from level i to level j. $Tp_0$ denotes the programming to the base level (reset in R2S and set in S2R). Programming is determined by worst-case cell transition, which is likely to be full transition from the base level to the highest level when programming a sufficient amount of data (e.g. 32 bits). With a Conventional four-level cell and Conventional scheme:

$$T_{CONV} = Tp_0 + \max\{Tp_{0 \to 1}, T_{0 \to 2}, Tp_{0 \to 3}\} \quad (8)$$

Which is 420 ns for R2S and 350 ns for S2R.

Assuming $T_{read}$=50 ns, Multipage yields:

$$T_{MP} = \frac{(Tp_0 + Tp_{0 \to 1}) + T_{read} + Tp_0 + \max\{Tp_{1 \to 2}, Tp_{0 \to 3}\}}{2} \quad (9)$$

This is 340 ns (325 ns) for R2S (S2R), a 25% (14%) improvement over Conventional. With MMLP:

$$T_{MMLP} = \frac{(Tp_0 + Tp_{0 \to 1}) + (Tp_0 + Tp_{0 \to 1})}{4} + \\
+ \frac{T_{read} + Tp_0 + \max\{Tp_{0 \to 1}, Tp_{0 \to 2}, Tp_{1 \to 2}\}}{4} + \\
\frac{T_{read} + Tp_0 + \max\{Tp_{0 \to 2}, Tp_{1 \to 3}, Tp_{2 \to 3}\}}{4} \quad (10)$$

This is 265 ns (300 ns) for R2S (S2R), a 24% (8%) and 37% (15%) improvement over MP and Conventional, respectively.

TABLE 5

| Level | Value [ns] |
|---|---|
| 00-Reset | 75 |
| 01-State | 210 |
| 11-State | 270 |
| 10-Set | 420 |

Table. 5 illustrates a Reset to Set (R2S) PCM Programming.

TABLE 6

| Level | Value [ns] |
|---|---|
| 00-Set | 200 |
| 01-State | 250 |
| 11-State | 300 |
| 10-Reset | 350 |

Table. 6 illustrates a Set to Reset (S2R) PCM Programming.

FIGS. 8A-8C include graphs 810, 820 and 830 that illustrate pulse duration and magnitude in Flash and PCM MLC programming. FIG. 8A illustrates a constant pulse width, with read verify after each pulse in Flash (ISPP—Incremental Step Pulse Programming). FIG. 8B illustrates a Set to Reset (S2R) accumulated pulses in PCM. While programming a cell to high level, previous levels have to be programmed. FIG. 8C illustrates a Reset to Set (R2S) pulses to program for each level in PCM. R2S are more accurate due to shorter pulses and are more popular [14]. FIGS. 8B and 8C were adopted from [14].

More on Related Work

This section provides further details and references to related work on MLC program schemes.

Figure 13:
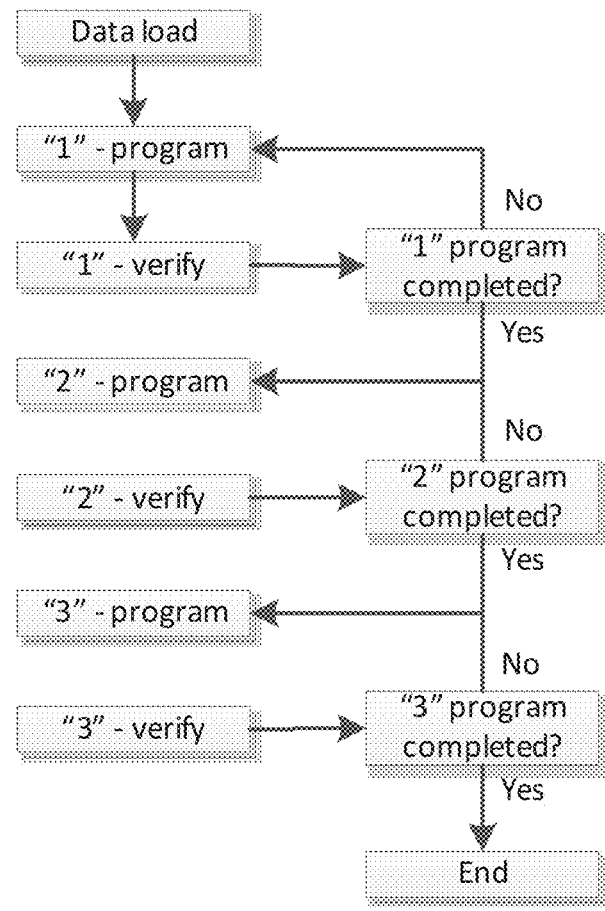
FIGS. 13-16 illustrate various methods for writing to memory cells.
Figure 14:
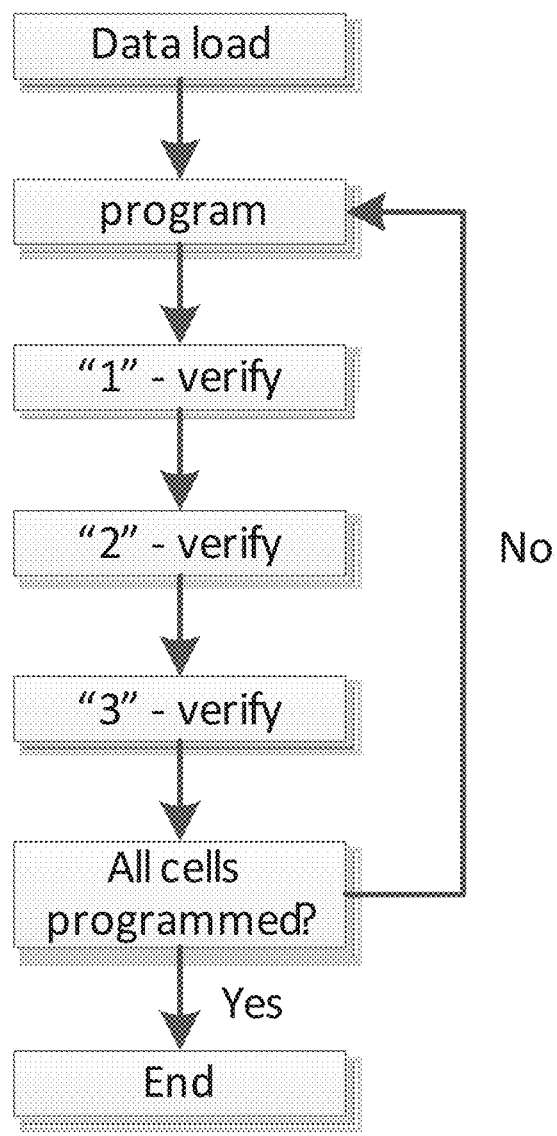
Figure 15:
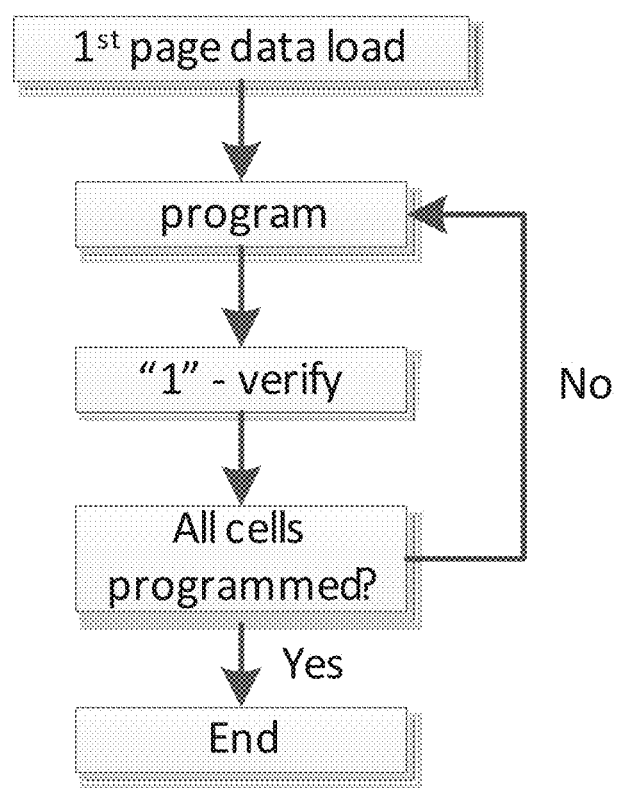
Figure 16:
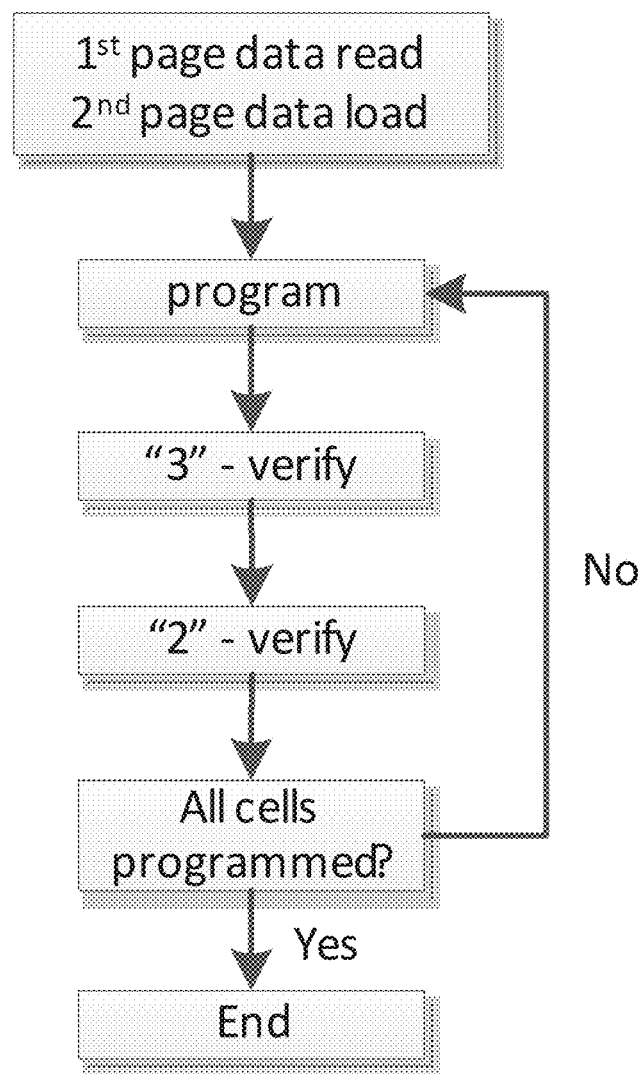

Conventional Programming (CP) [20, 21] (FIG. 13A for 4-level cells). This scheme limits programming concurrency. Consider 0→2 and 1→3 cell required cell transitions. The 1→3 cell is masked once it reaches 2, until the 0→2 cell reaches 2 and the reference is changed to 3, even though it needs additional pulses. This prolongs programming.

Simultaneous MLC programming (SMP) [20, 21] (FIG. 13B). Here, each program pulse is applied to all cells whose levels have yet to be raised, followed by verify steps for all relevant reference voltages. This minimizes the total number of program pulses. However, verification following each pulse is carried out for one level at a time, possibly increasing total programming time.

The use of multiple verifies following the same pulse can be beneficial mostly when no level-change interval contains all others. E.g., there is no containment between 0→2 and 1→3, whereas 0→3 contains 1→2 (containment may be affected by data encoding). The required number of program pulses also depends on cell sensitivity and sensitivity variation among cells. Yet, when at least hundreds of cells are programmed concurrently, one can assume the existence of insensitive cells, which dictate programming time.

Multipage programming (MP) [8] (FIG. 13C). In MP, each cell is shared among two pages. MP also uses simultaneous programming.

Consider, for example, 2-bit (4-level) cells, where the number of cells accessed in each write is double the number of bits to be stored. The first data page is stored using the first two levels of the cells. The second page, written at some later time, uses all those cells' levels. With many cells per page, one must assume that there is some cell at every level. Since a page's cells are programmed concurrently, programming time will be determined by the worst case.

The programming time of the first page is $Np_{0\to1}(T_{pulse}+T_{vfy})$, while that of the subsequently written second page is $\max\{Np_{0\to3}, Np_{1\to2}\}(T_{pulse}+2T_{vfy})$.

In MP, RAM-resident metadata is assumed to inform whether the first or second page is being written, but second page encoding requires knowledge of the level of each cell following the first page write, hence the extra $T_{read}$.

Evolution of device-level approaches includes differential program pulses [22], dual program pulse [23], program voltage optimization [24, 25] and statistical reduction in verification time [26]. Program schemes that consider inter-cell interference effects are described in [27, 28, 29, 30]. System-level approaches include pipelined program cache and cache page copy are described in [31, 32]. Multipage and multi-chip operations are described in [8,33].

FIGS. 8A-8C illustrate that there is a dependency of programming time on the (old, new) levels of a set of cells, and this time also depends on the programming scheme. If pulses are applied simultaneously to all cells that need a level raise (and multiple verification steps take place after each pulse because different cells among these have different target levels) then the thing that matters most is the maximum (over cells) difference between the target level and the current level.

Accordingly the MMLP may include applying pulses only to those cells whose target level is 1 or higher and are currently at level 0, then only to those cells currently at level 1 (possibly having just been raised to it from 0) whose target is 2 or higher, etc., then what matters is the difference between the highest and lowest target levels of cells that were not already at their target level. For example, if there are levels 0,1,2,3 and there is a cell that needs to go from 0 to >0 and one that needs to go to 4 and is currently at 3 or below then we need to pay the maximum price (time).

FIGS. 13-16 illustrates various methods 1300-1600 for writing to memory cells.

The invention may also be implemented in a computer program for running on a computer system, at least including code portions for performing steps of a method according to the invention when run on a programmable apparatus, such as a computer system or enabling a programmable apparatus to perform functions of a device or system according to the invention. A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for writing data, the method comprising:
   evaluating current levels of multiple memory cells that belong to a certain set of memory cells or receiving an indication about the current levels of the multiple memory cells;
   encoding a new data unit to provide an encoded data unit to be written to the multiple memory cells while minimizing an amount of changes in levels of the multiple memory cells required for storing the encoded data unit; and
   writing the encoded data unit to the multiple memory cells.

2. The method according to claim 1, comprising defining the encoding so that a $k^{th}$ writing of a data bit to a memory cell comprises utilizing only a lowest (k+1)'th levels of the memory cell.

3. The method according to claim 1, wherein the multiple memory cells are flash memory cells.

4. The method according to claim 1, comprising writing to the multiple memory cells multiple encoded data units that belong to multiple logical pages whereby a plurality of memory cells of the multiple memory cells store information relating to more than a single logical page; and generating error correction information that reflects a state of the multiple memory cells.

5. The method according to claim 4, comprising generating the error correction information only after reaching a maximal capacity of the multiple memory cells.

6. A system comprising a memory controller that comprises a read circuit, a write circuit and an encoder;
wherein the read circuit is arranged to evaluate current levels of multiple memory cells that belong to a certain set of memory cells or receiving an indication about the current levels of the multiple memory cells;
wherein the encoder is arranged to encode a new data unit to be written to the certain set of memory cells to provide an encoded data unit to be written to the certain set of memory cells while minimizing an amount of changes in levels of the multiple memory cells required for storing the encoded data unit; and
wherein the write circuit is arranged to write the encoded data unit to the certain set of memory cells.

7. The system according to claim 6, wherein the encoder is arranged to perform the encoding so that a $k^{th}$ writing of a data bit to a memory cell comprises utilizing only a lowest (k+1)'th levels of the memory cell.

8. The system according to claim 6, wherein the memory cells are flash memory cells.

9. The system according to claim 6, wherein the write circuit is arranged to write to the multiple memory cells multiple encoded data units that belong to multiple logical pages wherein a plurality of memory cells of the multiple memory cells store information relating to more than a single logical page; and wherein the encoder is further adapted to generate error correction information that reflects a state of the multiple memory cells.

10. The system according to claim 9, wherein the encoder is arranged to generate the error correction information only after reaching a maximal capacity of the multiple memory cells.

11. A non-transitory computer readable medium that stores instructions for: evaluating current levels of multiple memory cells that belong to a certain set of memory cells or receiving an indication about the current levels of the multiple memory cells; encoding a new data unit to provide an encoded data unit to be written to the multiple memory cells while minimizing an amount of changes in levels of the multiple memory cells required for storing the encoded data unit; and writing the encoded data unit to the multiple memory cells.

12. The non-transitory computer readable medium according to claim 11, that stores instructions for defining the encoding so that a $k^{th}$ writing of a data bit to a memory cell comprises utilizing only a lowest (k+1)'th levels of the memory cell.

13. The non-transitory computer readable medium according to claim 11, wherein the multiple memory cells are flash memory cells.

14. The non-transitory computer readable medium according to claim 11, that stores instructions for writing to the multiple memory cells multiple encoded data units that belong to multiple logical pages whereby a plurality of memory cells of the multiple memory cells store information relating to more than a single logical page; and generating error correction information that reflects a state of the multiple memory cells.

15. The non-transitory computer readable medium according to claim 14, that stores instructions for generating the error correction information only after reaching a maximal capacity of the multiple memory cells.

* * * * *